(12) United States Patent
Leffel

(10) Patent No.: US 7,109,792 B2
(45) Date of Patent: Sep. 19, 2006

(54) TABLE-BASED PRE-DISTORTION FOR AMPLIFIER SYSTEMS

(75) Inventor: Michael David Leffel, Crystal Lake, IL (US)

(73) Assignee: Andrew Corporation, Westchester, IL (US)

( * ) Notice: Subject to any disclaimer, the term of this patent is extended or adjusted under 35 U.S.C. 154(b) by 252 days.

(21) Appl. No.: 10/667,249

(22) Filed: Sep. 17, 2003

(65) Prior Publication Data

US 2005/0057303 A1    Mar. 17, 2005

(51) Int. Cl.
*H03F 1/26* (2006.01)
*H04K 1/02* (2006.01)

(52) U.S. Cl. ...................... 330/149; 375/297
(58) Field of Classification Search ............... 330/149; 375/296, 297; 455/126
See application file for complete search history.

(56) References Cited

U.S. PATENT DOCUMENTS

| | | | |
|---|---|---|---|
| 6,304,140 B1 * | 10/2001 | Thron et al. ............... | 330/149 |
| 6,356,146 B1 * | 3/2002 | Wright et al. ............... | 330/149 |
| 6,459,334 B1 * | 10/2002 | Wright et al. ............... | 330/2 |
| 6,587,513 B1 * | 7/2003 | Ichihara ...................... | 330/149 |
| 6,731,168 B1 * | 5/2004 | Hedberg et al. ............ | 330/149 |
| 2004/0264596 A1 * | 12/2004 | Vella-Coleiro ............. | 375/297 |

* cited by examiner

*Primary Examiner*—Khanh Van Nguyen
(74) *Attorney, Agent, or Firm*—Steve Mendelsohn

(57) ABSTRACT

Frequency-independent and frequency-dependent pre-distortion is implemented using look-up tables to retrieve pre-distortion parameters. To compensate for changes in amplifier operating characteristics over time, fixed pre-distortion tables can be used by appropriately offsetting the index values used to retrieve the pre-distortion parameters. The overall amplifier gain as well as the biases applied to one or more amplifier stages are also preferably controlled. In addition, the frequency-independent and/or frequency-dependent pre-distortion tables can be updated either periodically or as needed, by mapping a measure (e.g., average input signal power) to one or more parameters using equations (e.g., piecewise linear curves), where the parameters are applied to one or more polynomials to update the tables.

80 Claims, 17 Drawing Sheets

TABLE-BASED PRE-DISTORTION FOR AMPLIFIER SYSTEMS

CROSS-REFERENCE TO RELATED APPLICATIONS

The subject matter of this application is related to the subject matter of U.S. patent application Ser. No. 09/395,490, filed on Sep. 14, 1999 ("the '490 application") as well as U.S. patent application Ser. No. 10/068,343, filed on Feb. 5, 2002 ("the '343 application"), the teachings of both of which are incorporated herein by reference.

BACKGROUND OF THE INVENTION

1. Field of the Invention

The present invention relates to signal processing, and, in particular, to the pre-distortion of amplified signals for transmission, for example, in a wireless communication network, to reduce spurious emissions.

2. Description of the Related Art

Modern wireless communication networks employ complex modulation schemes that necessitate tight control of spurious emissions (sometimes called "out-of-band emissions") in order to avoid interfering with neighboring carriers and to comply with the requirements of regulatory bodies (e.g., FCC) and standards bodies (e.g. ITU). One source of spurious emissions is the base station transmitter amplifier that is used to amplify signals prior to transmission as wireless (e.g., RF) signals to wireless (e.g., mobile) units in a wireless communication network, such as a cellular voice and/or data network. Prior art techniques for reducing such spurious emissions were able to satisfy previous requirements. However, recent developments in wireless communication networks (e.g., Universal Mobile Telecommunication Service (UMTS)) place additional burden on the base station transmitter amplifier and make it advantageous to reduce the spurious emissions even further.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

The '490 application describes a technique for reducing spurious emissions using digital pre-distortion that was sufficient to meet previously existing regulations and standards. According to the '490 application, frequency-independent magnitude and phase pre-distortion is applied to an input signal to generate a pre-distorted signal that reduces spurious emissions when the pre-distorted signal is subsequently amplified by an amplifier. According to certain embodiments of the present invention, frequency-dependent phase pre-distortion is applied to generate one or more additional pre-distortion components that, when combined with the main (frequency-independent) pre-distorted signal described in the '490 application, can further reduce spurious emissions in the amplified signal. The following section provides a description of the frequency-independent pre-distortion technique taught in the '490 application. Following that is a description of a frequency-dependent pre-distortion technique taught in the '343 application, which is preferably combined with—but does not necessarily have to be combined with—the pre-distortion technique of the '490 application to further reduce spurious emissions in communications networks.

Pre-Distortion Technique of the '490 Application

The pre-distortion technique described in the '490 application reduces adjacent channel power in wireless communication networks. In particular, the '490 application describes a technique for digitally and adaptively pre-distorting an outgoing signal that involves applying a correction to the signal before it is applied, e.g., to the input of a base station transmitter amplifier, such that the correction is equal and opposite to at least some of the anticipated distortion produced by the amplifier. The correction causes at least some of the amplifier distortion to be canceled, resulting in a base station transmitter having a more linear transfer characteristic than a corresponding transmitter without such pre-distortion. In these circumstances, the adjacent channel power (i.e., spurious emission) is desirably reduced.

Figure 1:
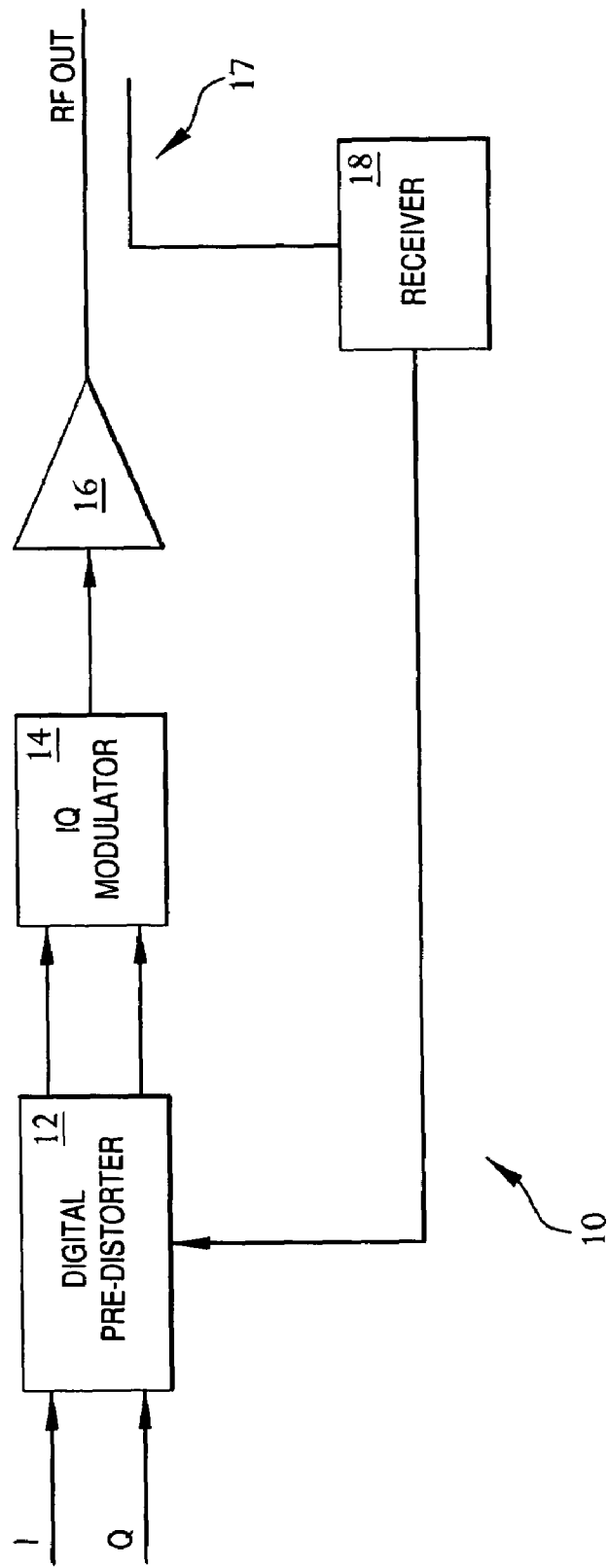
FIG. 1 shows a block diagram of a system, in accordance with the (frequency-independent) pre-distortion technique described in the U.S. application Ser. No. 09/395,490.

FIG. 1 shows a block diagram of an amplifier system 10, in accordance with the pre-distortion technique described in the '490 application. System 10 includes a digital pre-distorter 12 for receiving the in-phase (I) and quadrature (Q) components of a digital baseband input signal, an IQ modulator 14 connected to the output of pre-distorter 12, an amplifier 16 connected to the output of modulator 14, and a receiver 18 that is coupled to the output of amplifier 16 through a coupler 17 in order to generate a control signal that is fed back to pre-distorter 12. These components are configured to apply a correction to the digital baseband input signal (e.g., a code division multiple access (CDMA) signal, a wide-band CDMA signal, a time division multiple access (TDMA) signal, an enhanced data rates through global system for mobile communications evolution (EDGE) signal, or other signal, preferably with a substantially large peak power to average power ratio) generated by a communication device—such as a base station used for transmitting wireless communication data—and applied to pre-distorter 12 as the input signal (I, Q). System 10 also provides adaptive feedback through receiver 18 to optimize the correction by modifying coefficients and/or look-up table entries.

More specifically, this pre-distortion technique comprises applying a correction to a digital baseband signal before the signal is applied to an input of amplifier 16 such that the correction is opposite to at least a portion of the distortion produced by amplifier 16. Thus, the correction and some portion of the amplifier distortion cancel one another, resulting in a system with a more linear transfer characteristic. In system 10, in order to take advantage of the precision and low cost of digital circuits, digital pre-distorter 12 preferably performs its correction at baseband, before the signal is converted by modulator 14 to radio frequency (RF) for amplification and transmission.

According to this pre-distortion technique, pre-distorter 12 pre-distorts both the magnitude and the phase of the input signal as a function of the signal power (but independent of frequency). Since both the magnitude and phase corrections vary with the instantaneous power (i.e., envelope power), pre-distorter 12 relies on accurate descriptions of the amplifier magnitude and phase variations with power level to perform its function. As will be described below, the functional representation of the corrections (versus power level) are in the form of polynomial equations from which a look-up table (LUT) is preferably derived.

More particularly, the digital baseband signal is comprised of discrete time samples of in-phase (I) and quadrature (Q) components which, after digital-to-analog conversion (not shown), are applied to the vector IQ modulator 14 to generate an RF signal that is then input to amplifier 16. Each sample for the baseband signal can be represented in complex number notation as (I+jQ), where j is the square root of (−1). The pre-distortion operation of pre-distorter 12 can be represented according to Equations (1)–(3) as follows:

$$I'+jQ'=(I+jQ)(A+jB) \quad (1)$$

where $$I'=IA-QB \quad (2)$$

$$Q'=QA+IB \quad (3)$$

where I' and Q' are the pre-distorted in-phase and quadrature baseband signals generated by pre-distorter 12, and A and B are pre-distortion parameters that are a function of the instantaneous envelope power of the input signal represented by I and Q. Conveniently, different values for parameters A and B may be stored in a look-up table (which is generated as described below) with the index being the instantaneous envelope power given by ($I^2+Q^2$).

Figure 2:
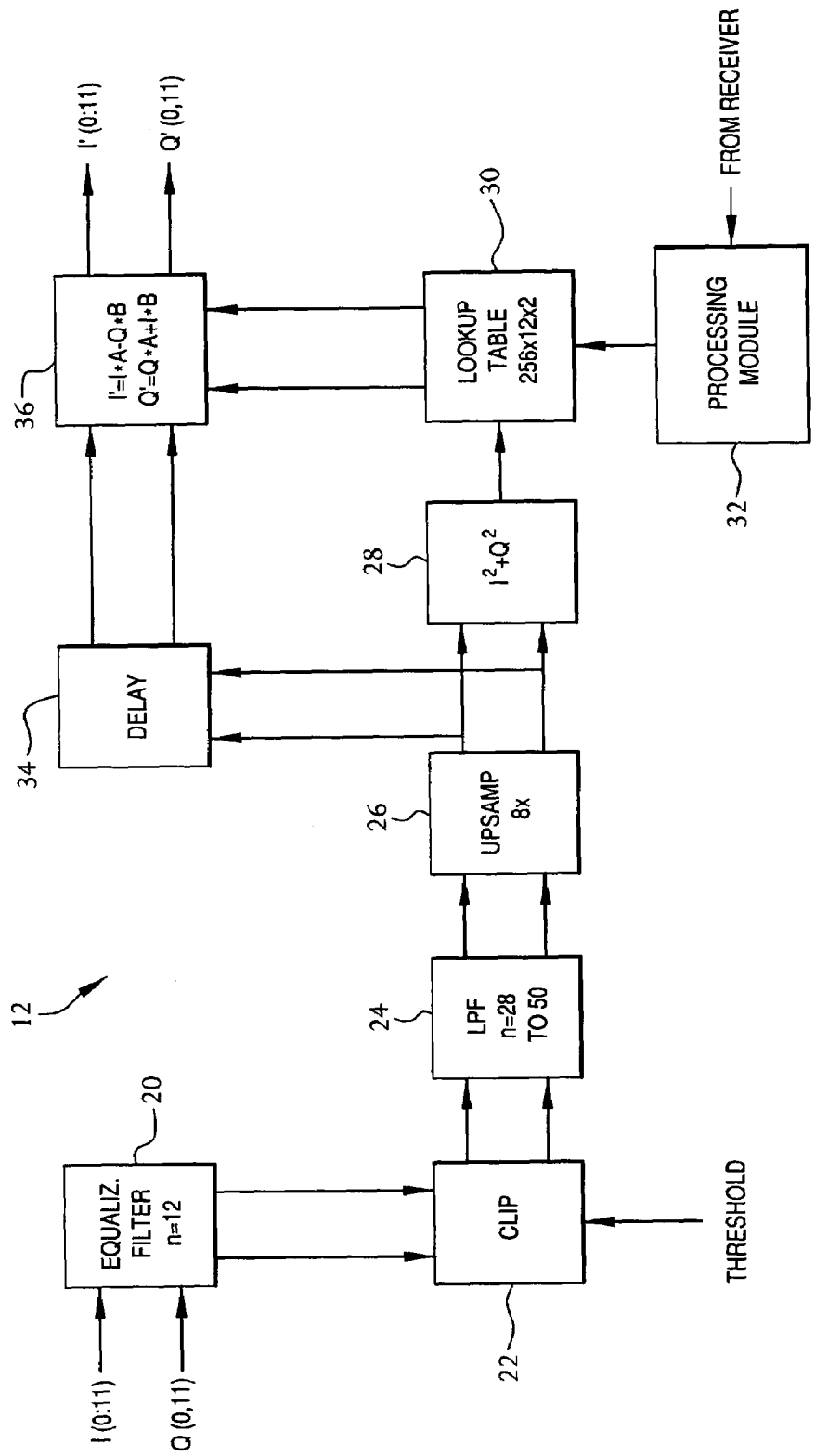
FIG. 2 shows a block diagram of the digital pre-distorter of FIG. 1.

FIG. 2 shows a block diagram of digital pre-distorter 12 of FIG. 1, in accordance with the pre-distortion technique of the '490 application. As shown in FIG. 2, pre-distorter 12 includes an equalization filter 20 for receiving the signal that is comprised of the in-phase and quadrature components described above. The equalization filter is a component that is well known in the art and is operatively connected to a clipping module 22 that clips the signal to a predetermined threshold. The output of clipping module 22 is fed to a low-pass filter 24 that eliminates the high-frequency components that are generated during clipping.

The output of low-pass filter 24 is fed to a sampling module 26 that provides an up-sampled signal (e.g., increases the sampling rate by a factor of four from an original 2× rate to an 8× rate) to an index-calculating module 28, which calculates an index value based on the sum of the squares of the in-phase and quadrature components of the baseband signal. Index-calculating module 28 is connected to a look-up table 30 having stored therein parameters A and B. Values for parameters A and B are retrieved based on the calculated index value.

The pre-distortion parameters A and B of look-up table 30 are derived from a set of polynomial equations that closely approximate the corrections used to linearize the amplifier characteristics. Because of the complex nature of the characteristics of amplifiers, such as class AB amplifiers, advantageous results are obtained by using a pair of polynomial equations for parameter B, while a single polynomial equation is sufficient for parameter A. (As an approximation, it can be said that parameter A corrects the magnitude distortion of the amplifier, while parameter B corrects the phase distortion.) These polynomial equations can be written according to Equations (4)–(7) as follows:

$$A=C_0+C_1P+C_2P^2+C_3P^3 \text{ for } A \leq A_m \quad (4)$$

$$A=A_m \text{ otherwise} \quad (5)$$

$$B=C_4P+C_5P^2+C_6P^3 \text{ for } P \leq P_b \quad (6)$$

$$B=(B_{b1}-B_{b2})+C_7P+C_8P^2+C_9P^3 \text{ for } P>P_b \quad (7)$$

where $P=(I^2+Q^2)$ is the instantaneous envelope power. $A_m$ is a maximum value imposed on parameter A to prevent the amplifier from being driven deep into saturation. A typical value for $A_m$ is 2, but it can vary depending on the detailed design. $P_b$ is a breakpoint where parameter B transitions between Equations (6) and (7). $P_b$ is an optimizable parameter whose value is obtained by the optimization algorithm. The value varies from amplifier to amplifier. It can also vary with temperature. $B_{b1}$ and $B_{b2}$ are the values of parameter B at $P=P_b$ using Equations (6) and (7), respectively. The first term on the right-hand side of Equation (7) is intended to make Equations (6) and (7) continuous at $P=P_b$. $C_0$ through $C_9$ are coefficients that pertain to the transfer function characteristics of a particular amplifier and which can vary with temperature, aging of the amplifier components, etc. As with $P_b$, the optimization algorithm finds values for coefficients $C_0$ through $C_9$ that give optimized results for a particular set of operating conditions.

Of course, it should be appreciated that, in appropriate circumstances, two polynomial equations may be used for parameter A as well as for parameter B. Furthermore, in many instances it is possible to reduce Equations (4) and (6) to exclude terms higher than the linear P term, resulting in Equations (4')–(7') as follows:

$$A=C_0+C_1P \text{ for } P \leq P_b \quad (4')$$

$$A=(A_{b1}-A_{b2})+C_2P+C_3P^2+C_4P^3 \text{ for } P>P_b \quad (5')$$

$$B=C_5P \text{ for } P \leq P_b \quad (6')$$

$$B=(B_{b1}-B_{b2})+C_6P+C_7P^2+C_8P^3 \text{ for } P>P_b \quad (7')$$

where $A_{b1}$ and $A_{b2}$ are the values of parameter A at $P=P_b$ using Equations (4') and (5'), respectively. As before, a maximum limit $A_m$ can be placed on the value of parameter A. Also, if necessary, the breakpoint $P_b$ where the transition is made from one polynomial equation to the other can have a different value for the A equations than for the B equations.

To accommodate the time-varying nature of the coefficients (e.g., $C_0$–$C_9$ in Equations (4)–(7)), an adaptive scheme may be employed in this pre-distortion technique whereby the values of the coefficients are at least intermittently optimized (or operated on) to maintain minimum or reduced spurious emissions. Referring again to FIG. 1, coupler 17 at the output of amplifier 16 samples the output, and receiver 18, which is tuned to the frequency region where the spurious emissions are to be reduced or minimized, generates a voltage proportional to the received power. Multiple receivers can be used to sample the spurious emissions at more than one frequency or a single receiver can tune sequentially to the different frequencies of interest. The voltages obtained at the different frequencies are then combined into a single quantity whose value is to be reduced or minimized. When two frequencies are used, which is generally sufficient, the resultant voltages, $V_1$ and $V_2$, can be combined according to Equation (8) as follows:

$$V = V_1 + V_2 + |(V_1 - V_2)| \quad (8)$$

where $|(V_1-V_2)|$ is the absolute value of $(V_1-V_2)$. Such use of an absolute value causes both $V_1$ and $V_2$ to be reduced or minimized, instead of simply providing the sum of the two values. If only the first two terms on the right-hand side of Equation (8) were used, the algorithm might find a false optimum by making one voltage very small and the other quite large. An alternative to Equation (8) is $V=\max(V_1, V_2)$, where max means choose the larger of the values.

A suitable algorithm to find the values of the coefficients that reduce or minimize V, and thus the spurious emissions, is the well-known simplex algorithm, described by Nelder and Mead in "A Simplex Method For Function Minimization," Computer Journal, Vol. 7, pp. 308–313 (1965), which is incorporated herein by reference. As will be described below, the algorithm is implemented in modified form.

Referring again to FIG. 2, based on the feed-back signal from receiver 18 of FIG. 1, processing module 32 (i.e., a controller) implements the modified simplex algorithm to update the values of parameters A and B stored in look-up table 30. It should be appreciated that processing module 32 may take a variety of forms such as a microprocessor, a digital signal processor, or a processing circuit using FPGA devices. It should be further appreciated that the simplex algorithm may be implemented in any suitable manner that utilizes appropriate combinations of hardware and software that will be apparent to those of skill in the art upon a reading hereof. Of course, the device used to implement the algorithm (here, module 32) should include suitable storage capacity to store and maintain the code and data necessary to run the algorithm.

At each iteration, the values of the coefficients derived by the algorithm are used in the equations for A and B described above to generate a table which is used by the algorithm for the next iteration. The algorithm is allowed to run continuously, or at least intermittently, so that the coefficient values track changes that occur over time.

The simplex optimization algorithm as developed by Nelder and Mead was intended for minimizing or reducing function values, which were obtained by mathematical computations. An important aspect of this mode of operation is that, if a computation is repeated, the same function value is obtained. This contrasts with values obtained by measurements on operating hardware where noise and fluctuations inevitably result in varying measured values. This difference has an important consequence when an attempt is made to use the simplex algorithm in real time on operating hardware.

The essence of the simplex algorithm is that, at each iteration, the set of coefficients that is associated with the worst function value is replaced with a new set which gives a better function value. This new value might or might not be better than the best function value obtained up to that time, but as the algorithm progresses it is expected that better and better function values will be obtained. Suppose that, as a result of noise and fluctuations in the measurements, an exceptionally good but erroneous value is obtained. If subsequent values obtained are all worse than this erroneous value, then the algorithm will converge on the erroneous value. Thus, in its conventional form, the algorithm is not very suitable for use in situations where considerable fluctuations exist in the quantity being optimized or operated on as may be in the present case.

To circumvent this difficulty, the simplex algorithm is used in modified form. At the end of each iteration, if the previous best value is replaced by a better value, then the algorithm proceeds to the next iteration. However, if an iteration does not yield a new best value, then the existing best point is re-evaluated and the new value is substituted for the previous one. Thus, the algorithm is able to recover from erroneous data due to fluctuating measurements. These fluctuations may result in a larger number of iterations in order to reach a desired point (which could be an optimum point), but will not prevent the desired point from being reached.

Another modification of the simplex algorithm enables it to operate continuously to track changes in amplifier characteristics caused by temperature changes, aging of components, or other disturbances. In the conventional implementation of the algorithm, an exit criterion is established (the criterion is usually related to the fractional variation of the function values between the worst and best points of the simplex) and the algorithm terminates when the criterion is satisfied. As the desired or optimum point is approached, the algorithm reduces the size of the simplex which typically becomes very small by the time the desired point is reached. Once this happens, the algorithm is no longer able to react to changes in amplifier characteristics.

In preferred implementations, the size of the simplex is prevented from becoming too small by comparing it to a value, such as a preset minimum value, at the start of each iteration and increasing the size to the value if it has been reduced below it. The value is chosen such that it is large enough to enable the algorithm to track changes in the amplifier characteristics but not so large that the desired (or optimum) point cannot be reached. A suitable value is one where the value of each coefficient at the worst point of the simplex differs from the corresponding value at the best point by 5 to 10 per cent.

With continuing reference to FIG. 2, the output of sampling module 26 is also connected to a delay circuit 34, which is, in turn, connected to an output module 36 that generates an output signal based on the values of parameters A and B retrieved from look-up table 30 and the delayed upsampled signal from delay circuit 34. The delay applied by delay circuit 34 is preferably equivalent to the delay involved in performing the processing of modules 28 and 30 so that the appropriate values of (I and Q) and (A and B) arrive at output module 36 at the same time.

Figure 3:
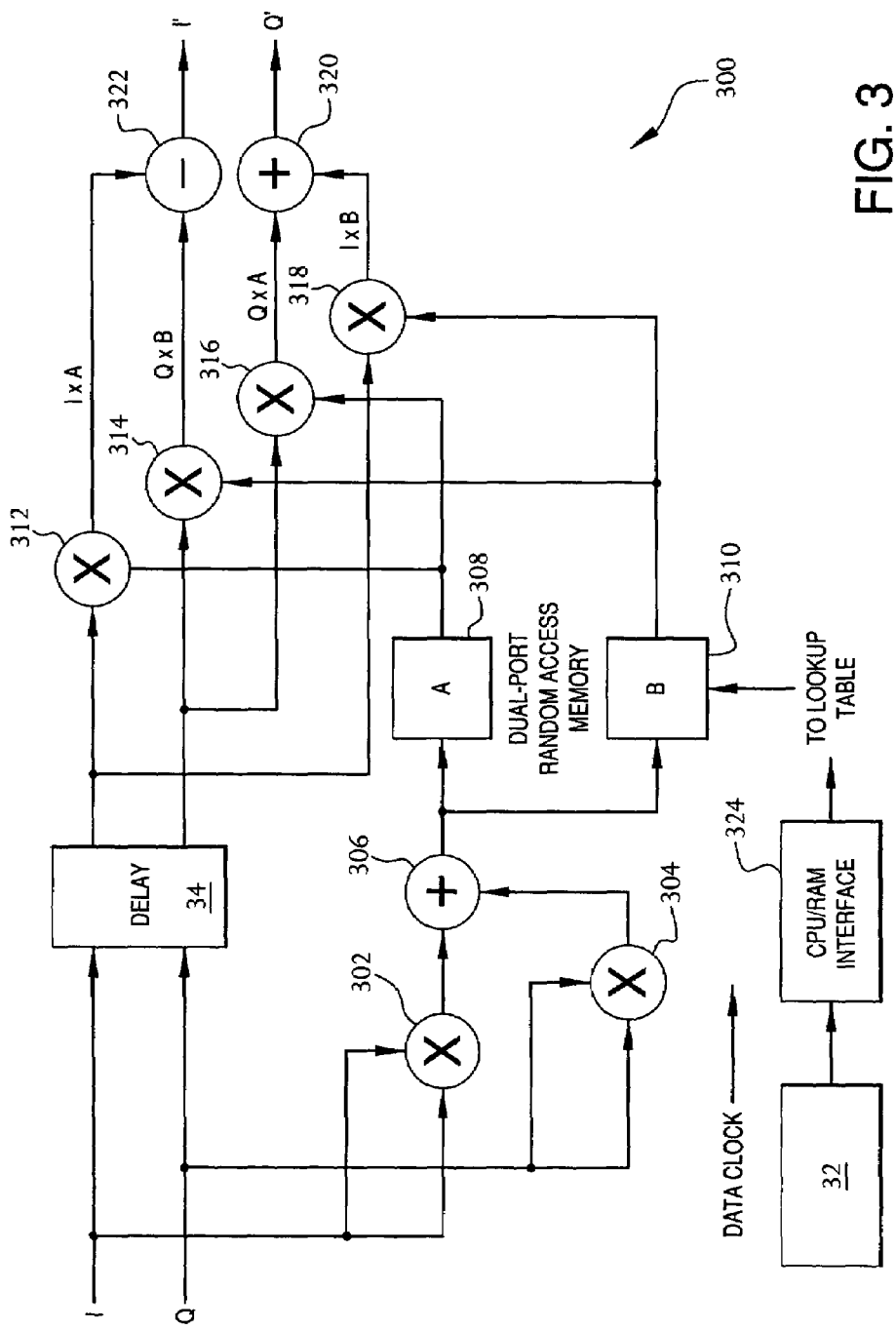
FIG. 3 shows a block diagram of an exemplary FPGA implementation of the index-calculating module, the delay block, the look-up table, and the output module of FIG. 2.

FIG. 3 shows a block diagram of an exemplary FPGA implementation 300 of index-calculating module 28, delay 34, look-up table 30, and output module 36 of FIG. 2. The I and Q data paths are independently squared at multipliers 302 and 304 to create $I^2$ and $Q^2$, respectively. These two values are added together at adder block 306 to form an index address for look-up table 30, which, in FIG. 3, takes the form of two separate dual-port RAM memory blocks 308 and 310, which contain the parameters A and B, respectively. The parameters output from the memory blocks are multiplied by the delayed I and Q values at multipliers 312, 314, 316, and 318 to create the four values I×A, I×B, Q×A, and Q×B. These are combined by adder and subtractor blocks 320 and 322 to form (IA−QB) and (QA+IB), respectively, which are output as I' and Q'.

Additional circuitry 324 loads the dual-port memory blocks 308 and 310 with parameter data generated in processing module 32 using standard memory interface signals. The use of dual-port memory permits real-time updating of the look-up tables without disrupting the accessing of parameter values by the pre-distortion process.

A look-up table configuration is not necessary where, for example, the processing module has a sufficiently high processing speed to allow for the obtaining of the A and B parameters on an "as needed" basis. In this case, the processing module calculates the appropriate coefficients and the A and B parameters are subsequently calculated by the processing module as needed or desired without storing such parameters in a look-up table.

Referring again to FIG. 1, receiver 18 in the digital pre-distortion adaptive feedback loop is used to measure the RF power over a narrow bandwidth at a specific frequency. This tuned frequency is offset from, for example, the main CDMA carrier frequency and is a frequency where the spurious emissions are to be minimized by the optimization algorithm.

Figure 4:
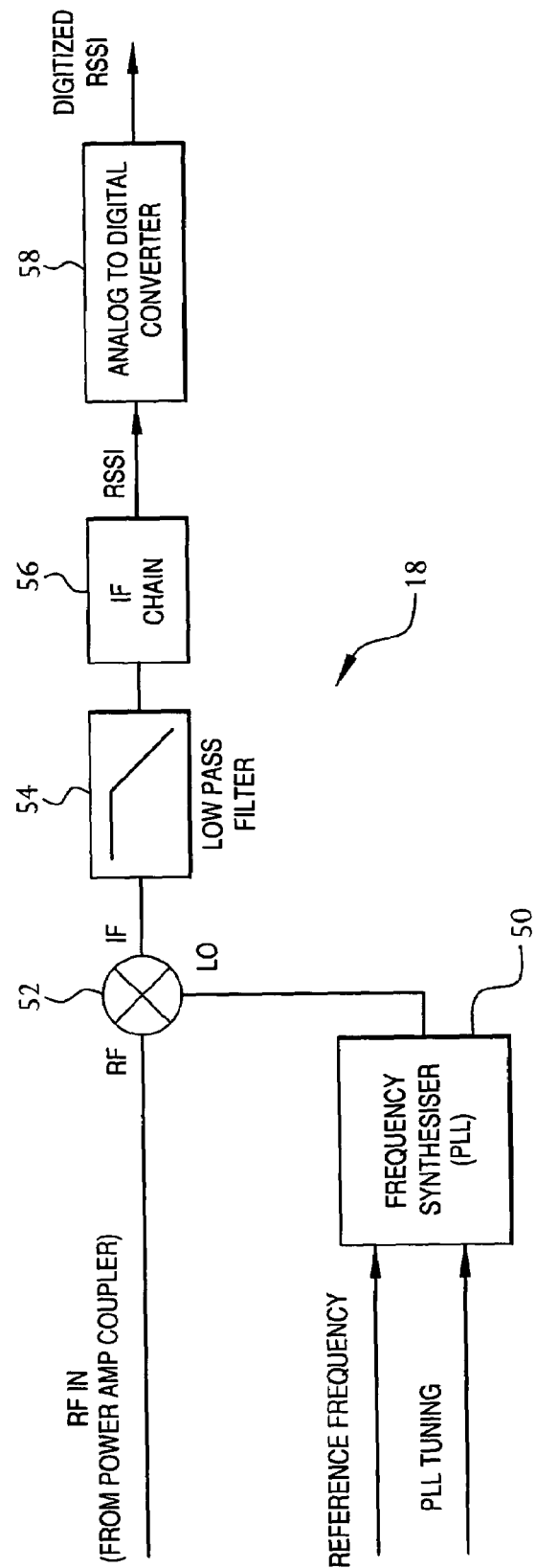
FIG. 4 shows a block diagram of an exemplary single-channel, single-conversion implementation of the receiver of FIG. 1.

FIG. 4 shows a block diagram of an exemplary single-channel, single-conversion implementation of receiver 18 of FIG. 1. In this implementation, receiver 18 includes a frequency synthesizer 50, which is connected to a mixer 52. The output of mixer 52 is connected to a low-pass filter 54, which in turn is connected to an intermediate frequency (IF) chain 56. The output of IF chain 56 is connected to an analog-to-digital converter (ADC) 58, which then provides input to processing module 32 of FIG. 2. Three important frequencies in FIG. 4 are the RF frequency where the adjacent power level is to be measured, the local oscillator (LO) frequency which is varied as needed to tune the receiver, and intermediate frequency (IF) which is fixed. The LO frequency is found by LO=RF−IF.

More particularly, as shown in FIG. 1, the RF input of receiver 18 is coupled off the output of power amplifier 16 by coupler 17. This wide-band RF signal is down-converted to an intermediate frequency (IF) at mixer 52, where IF=RF−LO. The LO frequency for mixer 52 is generated by a phase-locked loop (PLL) frequency synthesizer 50. This LO frequency is set by (digital) tuning commands from a microprocessor (e.g., processing module 32 of FIG. 2).

Low-pass filter 54 is used to filter the RF+LO frequency products, as well as the RF and LO feed-through, and any higher frequency products produced by mixer 52. The receiver IF chain 56 is shown as a single block in FIG. 4. In one implementation, IF chain 56 actually includes amplifiers and a narrow bandpass filter, which assures that the power being measured is truly the power at the tuned frequency and does not contain power from, for example, the main CDMA carrier. IF chain 56 produces a Received Signal Strength Indicator (RSSI) voltage output that is proportional to the IF power, which in turn is proportional to the RF power. The RSSI voltage is sampled by ADC 58, where the resulting digitized RSSI is a digital word (which represents the power level at the tuned frequency) that is used by the optimization algorithm implemented by processing module 32 of FIG. 2.

In some implementations, the optimization algorithm monitors the spurious emissions at multiple frequency points, in which case, the single-channel receiver of FIG. 4 may be re-tuned for each different frequency. This re-tuning can be done with a procedure similar to the following:

A microprocessor (e.g., processing module 32) sends a tuning command to the frequency synthesizer to set the LO frequency (and therefore the receiver's tuned frequency).

The microprocessor waits for the PLL and RSSI to settle.

The digitized RSSI value is read by the microprocessor. Multiple readings could be taken if an average RSSI is used.

These steps are repeated for the next frequency.

The pre-distortion technique of the '490 application was designed to correct for at least some of the non-linearities of the amplifier by pre-distorting both the magnitude of the baseband signal (primarily achieved using the parameter A) as well as the phase (primarily achieved using the parameter B). There are, however, applications where the characteristics of the signal (ratio of peak power to average power close to 1, as in a single-channel TDMA system) do not allow substantial expansion of the magnitude so that the magnitude non-linearity of the amplifier cannot be corrected as fully as might be desired. In these applications substantial improvement can be obtained by correcting the phase as much as possible (via the parameter B) and correcting the magnitude partially by appropriate setting of the $A_m$ value.

Frequency-Dependent Phase Pre-Distortion

As described in the previous section, the pre-distortion technique of the '490 application can be used to achieve a substantial reduction in spurious emissions, but it is frequently observed that some residual spurious emissions are still present. Attempts to reduce these residual spurious emissions by modifying the coefficients in Equations (4) to (7) (or in Equation (4') to (7')) result in an asymmetrical situation where a reduction in the spurious emissions on the low-frequency side of a communication channel are accompanied by an increase in the spurious emissions on the high-frequency side of the channel, and vice-versa, resulting in an overall degradation—or at least no overall improvement—in performance.

In order to reduce the spurious emissions to a level lower than that achieved by the (frequency-independent) pre-distortion technique of the '490 application, frequency-dependent phase distortion of the '343 application may also be applied, in which an element of pre-distortion with a phase that varies with frequency is added in such a manner as to produce a phase difference of 180° between a critical frequency on the low-frequency side of the channel and a corresponding critical frequency on the high-frequency side of the channel.

As used in this specification, the term "critical frequencies" refers to frequencies where the difference between the spurious emissions and the limits set by the relevant regulatory or standards body is largest (in the frequency region where the spurious emissions exceed the limits). These critical frequencies will, of course, depend on the particular standard being implemented. For example, the 3GPP (Third Generation Partnership Program) standard for UMTS sets spurious emissions limits at various frequency offsets from the center of the communication channel with the most difficult one to meet in many instances being a limit of −13 dBm in a bandwidth of 1 MHz at frequency offsets of ±4 MHz from the center of the communication channel. Thus, in this case, the critical frequencies are −4 MHz and 4 MHz away from the center of the channel. Using the criterion stated above, the additional pre-distortion component would have a phase difference of 180° between these two frequencies. Although 180° is preferred, other phase differences are possible, including those that differ only slightly from 180°. It will also be understood that, in addition to 180°, other preferred phase differences are $180° + n \times 360°$, where n is an integer. In addition, although critical frequencies are typically equidistant from the center of the channel, such equidistance is not strictly necessary.

A phase difference that varies with frequency can be produced by advancing or delaying in time an additional pre-distortion component relative to the main pre-distorted signal of the '490 application according to Equation (9) as follows:

$$\Delta\Phi = \pm 2\pi(\Delta f)\tau \quad (9)$$

where $\Delta\Phi$ is the phase difference between two critical frequencies, $\Delta f$ is the frequency difference between the two critical frequencies, and $\tau$ is the time difference between the main pre-distorted signal and the additional frequency-dependent phase distortion signal. In Equation (9), the plus sign refers to a time advance, and the minus sign refers to a time delay. Since a phase difference of 180° (i.e., $\pi$ radians) is desired, Equation (9) becomes Equation (10) as follows:

$$\tau = \pm 1/(2\Delta f) \quad (10)$$

For the UMTS example discussed above, where the frequency difference is 8 MHz, Equation (10) yields $\tau = \pm 62.5$ nanoseconds. A UMTS signal has a chip rate of 3.84 million samples/second (Ms/s) and a commonly used sampling rate is 8 times the chip rate, i.e., 30.72 Ms/s. At this sampling rate, two consecutive samples represent a time difference of 65.1 ns which is sufficiently close to the calculated value of 62.5 ns. Thus, in this example, the additional pre-distortion signal should be advanced or delayed by 2 samples relative to the main signal.

Single Additional Pre-Distortion Component

Equation (1) can now be re-written to include an additional, frequency-dependent phase pre-distortion component according to Equation (11) as follows:

$$I' + jQ' = (I + jQ)(A + jB) + (I + jQ)(X + jY)_n \quad (11)$$

where the subscript n indicates that the second term on the right hand side is advanced or delayed by n samples relative to the first term (e.g., n=2 for the example given above). In Equation 11, the parameters X and Y are functions of the instantaneous envelope power P analogously to the parameters A and B, and they can be written in polynomial form similar to Equations (4) to (7) (or (4') to (7')). (Note, however, that a constant term (i.e., analogous to $C_0$ in Equations (4) and (4')) is not included in the polynomial equation for X. If it were included, then the undistorted waveform would appear twice in the output.) In many instances, however, it is unnecessary to include all the terms in the polynomial equations; often just the term linear in P suffices, resulting in Equations (12) and (13) as follows:

$$X = C_{10} P \quad (12)$$

$$Y = C_{11} P \quad (13)$$

The two (or more if appropriate) new coefficients $C_{10}$ and $C_{11}$ are adaptively optimized along with the other coefficients in the manner described in the previous section for coefficients $C_0$–$C_9$.

Figure 5:
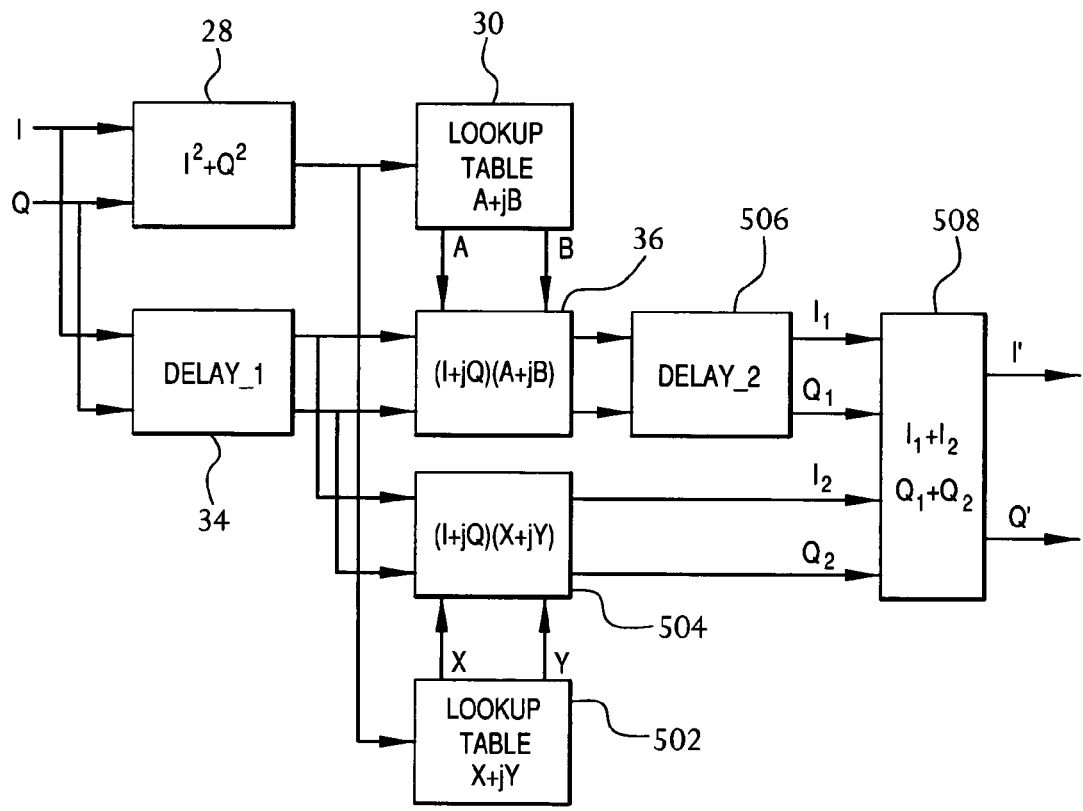
FIGS. 5 and 6 show block diagrams of implementations in which a frequency-dependent phase pre-distortion component is applied in conjunction with the main (frequency-independent) pre-distortion signal of the '490 application.
Figure 6:
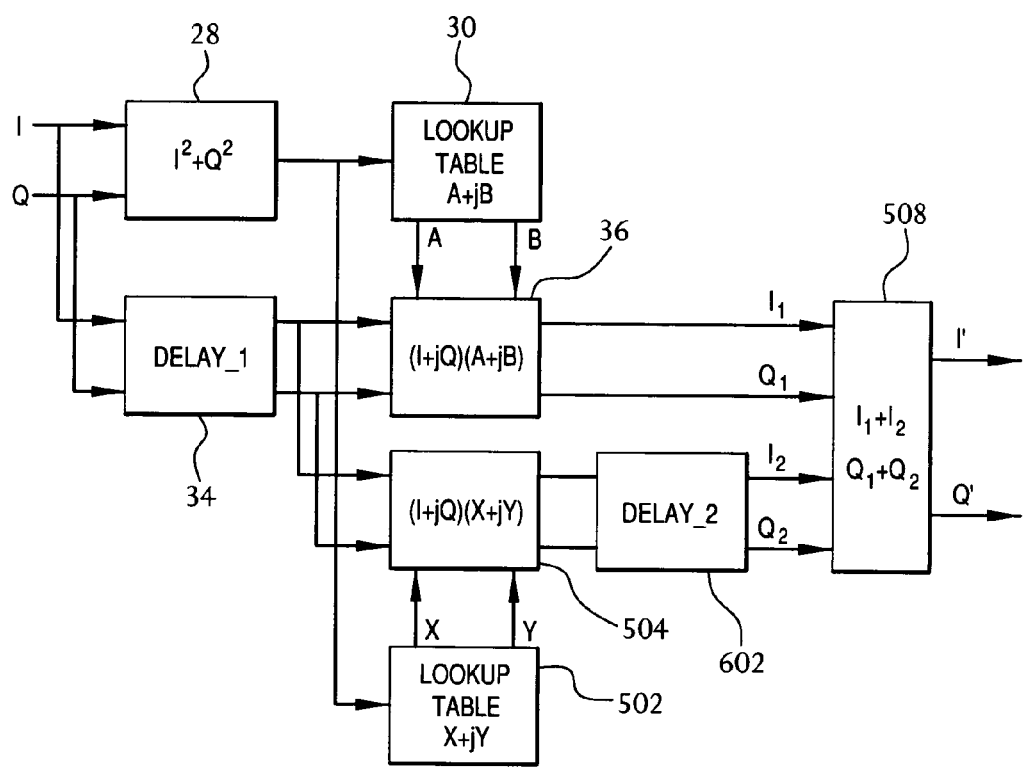

FIGS. 5 and 6 show block diagrams of hardware (e.g., FPGA, ASIC, or DSP) implementations in which an additional, frequency-dependent phase pre-distortion component of the '343 application is combined with the main pre-distorted signal generated in accordance with the '490 application. In particular, index-calculating module 28, look-up table 30, delay 34, and output module 36 of pre-distorter 12 of FIG. 2 are shown as being part of the configurations of FIGS. 5 and 6. In addition, in FIGS. 5 and 6, look-up table 502 retains values for the parameters X and Y that are accessed based on the index generated by module 28 and then used by module 504 to calculate the second term in Equation (11) (i.e., an additional, frequency-dependent phase pre-distortion component).

In FIG. 5, the main pre-distorted signal (i.e., the output of module 36) is delayed by delay block 506 relative to the additional pre-distortion signal (i.e., the output of module 504), thus effectively advancing in time the additional pre-distortion signal, while, in FIG. 6, the additional pre-distortion signal is shown delayed by delay block 602 relative to the main pre-distorted signal, thus effectively delaying in time the additional pre-distortion signal. In both figures, delay block 34 compensates for the time required to compute the value of $(I^2 + Q^2)$ by module 28 and retrieve values of A, B, X, and Y from look-up tables 30 and 502. The two configurations shown in FIGS. 5 and 6 produce similar results when the pre-distortion parameters X and Y have the opposite sign in one case relative to the other. In both FIGS. 5 and 6, the main pre-distorted signal $(I_1, Q_1)$ is combined with the additional pre-distortion signal $(I_2, Q_2)$ in module 508 to generate the new, combined pre-distorted signal $(I', Q')$, which may then be modulated and amplified (e.g., by modulator 14 and amplifier 16 of FIG. 1) for transmission.

In FIGS. 5 and 6, both sets of polynomial equations for A and B and for X and Y are shown implemented as look-up tables. In some instances, the value of Y is so small that setting Y=0 results in a negligible loss of performance. In this case, look-up table 502 for (X+jY) can be omitted, and module 504 for (I+jQ)(X+jY) can be replaced by (I+jQ)$C_{10}$P.

Multiple Additional, Frequency-Dependent Phase Pre-Distortion Components

The configurations of FIGS. 5 and 6 correspond to applications in which a single additional, frequency-dependent phase pre-distortion component has been added to achieve a desired (e.g., 180°) phase shift between a single pair of critical frequencies, one on either side of the channel. Situations also arise where more than one pair of critical frequencies exist, for example, in networks employing multiple carriers. In these cases, additional advanced/delayed pre-distortion paths can be included, whereby Equation (11) becomes Equation (14) as follows:

$$I' + jQ' = (I + jQ)(A + jB) + (I + jQ)(X_1 + Y_1)_{n1} + (I + jQ)(X_2 + jY_2)_{n2} + \cdots \quad (14)$$

where subscripts n1, n2, etc., represent the advances/delays associated with two or more different pairs of critical frequencies. Conventional standards specify frequencies that are symmetrical about the center frequency. In general, however, since the relationship between the frequency difference and the advance/delay does not need to be exact, there is some leeway if the frequencies are asymmetrical.

Figure 7:
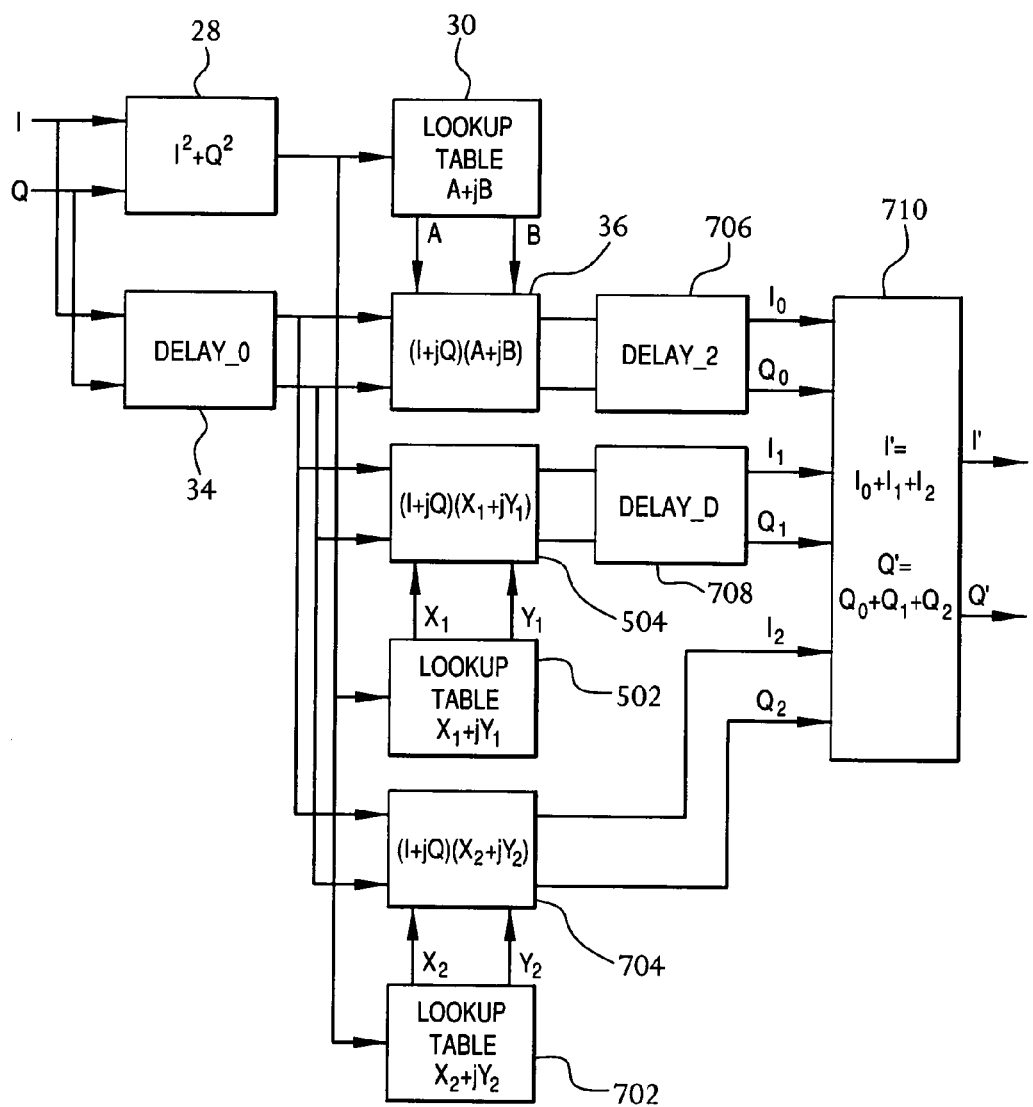
FIGS. 7 and 8 show block diagrams of implementations in which frequency-dependent phase pre-distortion components are included for two different pairs of critical frequencies.
Figure 8:
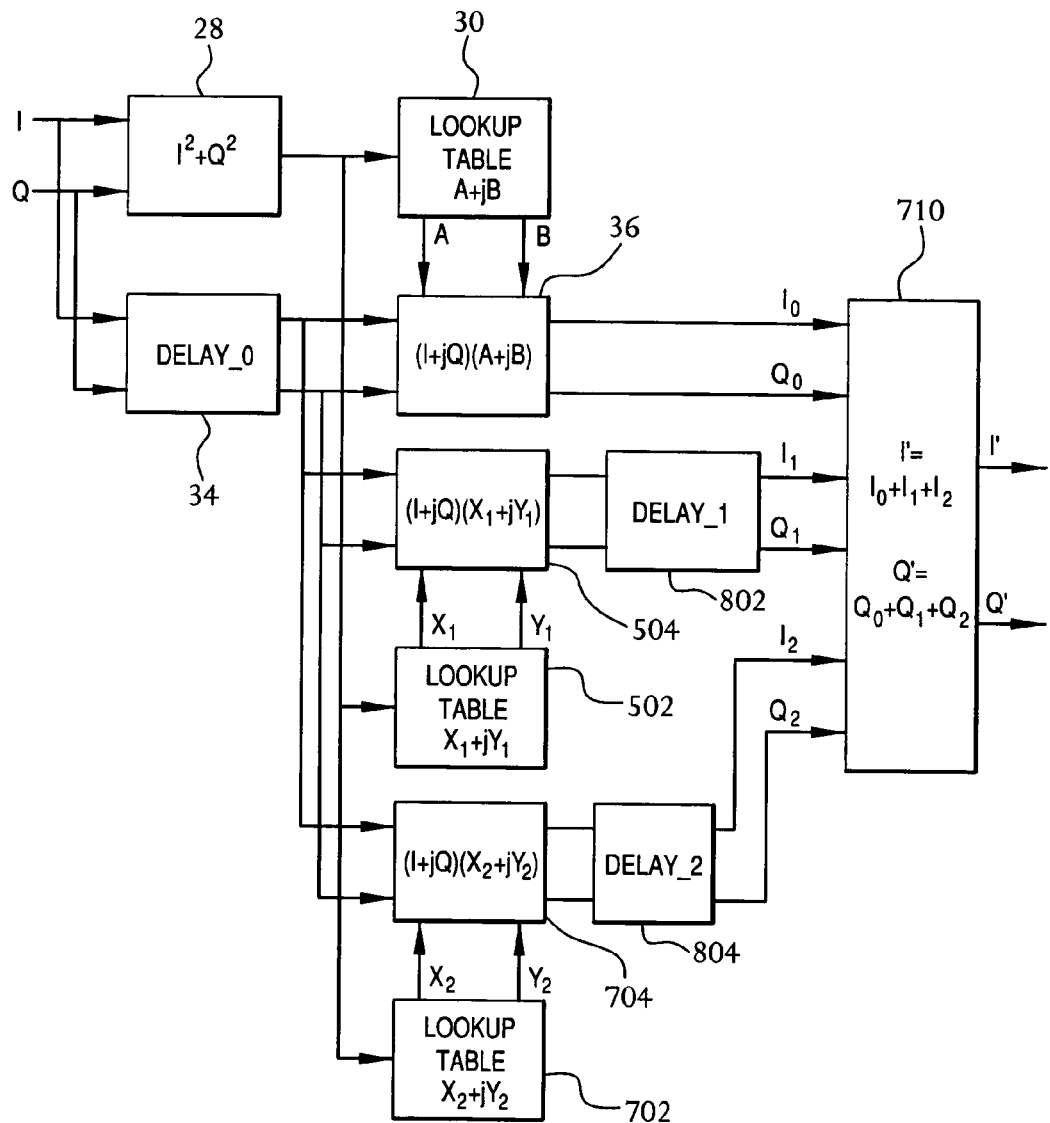

FIGS. 7 and 8 show block diagrams of two possible implementations of Equation (14) for applications in which additional, frequency-dependent phase pre-distortion components are included for two different pairs of critical frequencies, in which look-up table 502 and module 504 correspond to frequency-dependent phase pre-distortion based on a first pair of critical frequencies and look-up table 702 and module 704 correspond to frequency-dependent phase pre-distortion based on a second pair of critical frequencies. FIG. 7 corresponds to an "advanced-in-time" case, while FIG. 8 corresponds to a "delayed-in-time" case. In these figures, the number of additional pre-distortion components has been limited to two to avoid cluttering the figures, but additional components can be added in an analogous manner.

In FIG. 7, delay block 706 corresponds to the largest time advance in the implementation, while delay block 708 corresponds to the difference between that largest time advance and the time advance associated with the corresponding term in Equation (14). In FIG. 8, delay block 802 corresponds to delay n1 in Equation (14), while delay block 804 corresponds to delay n2 in Equation (14). In both configurations, module 710 combines the three different terms in Equation (14) to generate the combined pre-distortion values I' and Q'. As with FIGS. 5 and 6, the two configurations shown in FIGS. 7 and 8 produce similar results when the pre-distortion parameters in look-up tables 502 and 702 of one configuration have the opposite sign as the pre-distortion parameters in the corresponding look-up tables of the other configuration.

Frequency-Dependent Phase Pre-Distortion in the RF Domain

The implementations discussed so far are applicable to situations where the baseband signals I and Q are available. When the baseband signals are not readily available, it may be advantageous to apply pre-distortion to the input signal in the RF domain.

Figure 9:
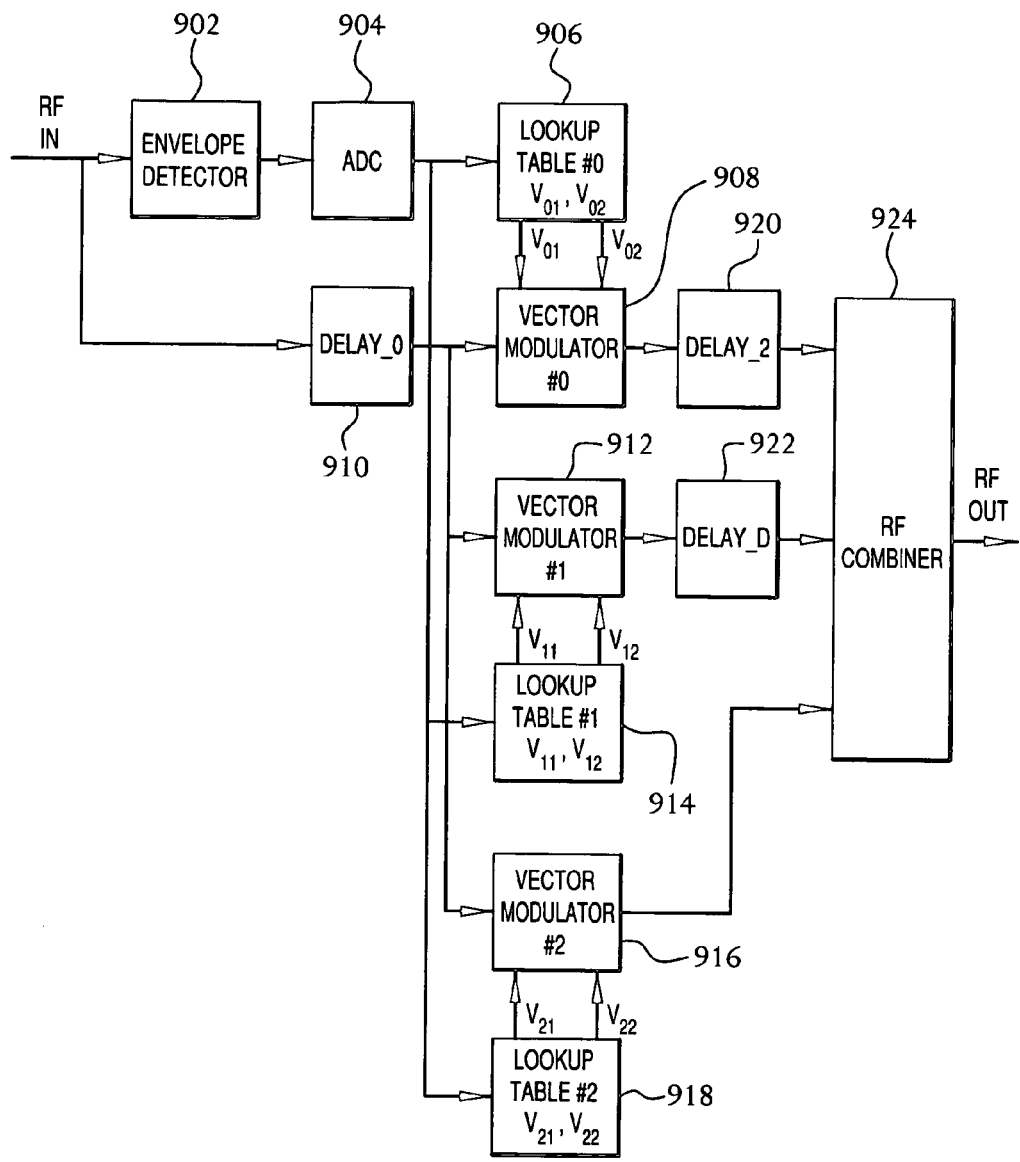
FIGS. 9 and 10 show block diagrams of implementations of RF-based pre-distorters.
Figure 10:
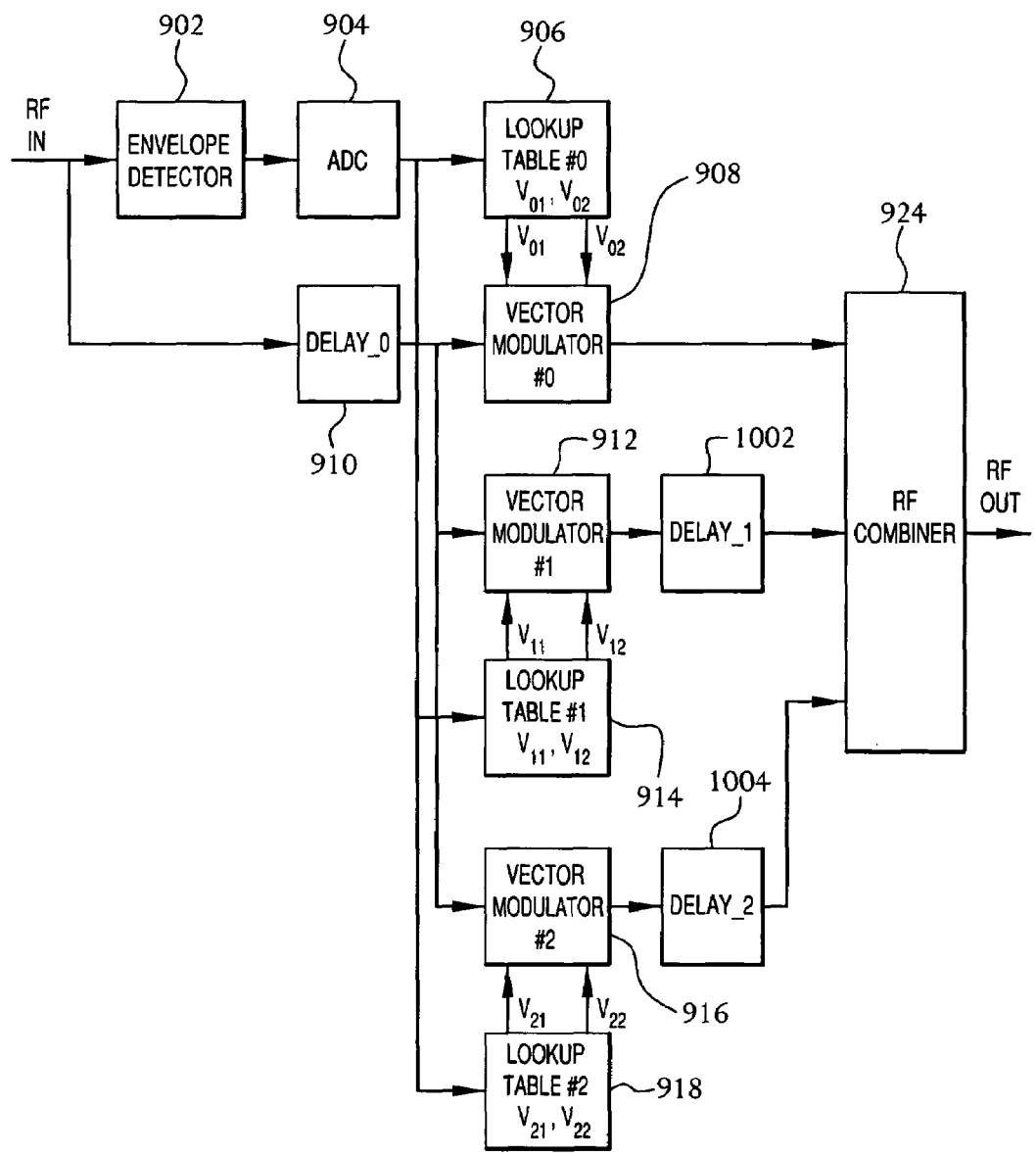

FIGS. 9 and 10 show block diagrams of possible hardware implementations of RF-based pre-distorters, according to two different embodiments. In FIGS. 9 and 10, two additional, frequency-dependent phase pre-distortion components are generated, although alternative embodiments may involve generation of only one or more than two such pre-distortion components. FIG. 9 shows a time-advance implementation, while FIG. 10 shows a time-delay implementation. With the exception of analog-to-digital converter (ADC) 904, there is a one-to-one correspondence between the modules in the RF implementations of FIGS. 9 and 10 and the modules in the baseband implementations of FIGS. 7 and 8. As with FIGS. 7 and 8, the two configurations shown in FIGS. 9 and 10 produce similar results when the pre-distortion parameters in look-up tables 914 and 918 of one configuration have the opposite sign as the pre-distortion parameters in the corresponding look-up tables of the other configuration.

In particular, in FIGS. 9 and 10, the RF input signal is split into two paths, one of which goes to envelope detector 902, which produces an output signal proportional to the instantaneous value of the RF input power. This signal is digitized by ADC 904, whose digital output is used to fetch a pair of control signal values (e.g., voltages $V_{o1}$ and $V_{o2}$) from look-up table 906. The pair of control signals is applied to vector modulator 908, whose function is to modify the magnitude and phase of the RF signal in accordance with the control signals. The second RF input signal path goes to delay block 910 (e.g., a length of coaxial cable), which causes the RF signal to arrive at vector modulator 908 at the same time as the control signals.

The output of delay block 910 is split into three RF signal paths corresponding to vector modulators 908, 912, and 916. The output of vector modulator 908 constitutes the main distorted signal, corresponding to $I_0$, $Q_0$ in FIGS. 7 and 8. Vector modulators 912 and 916 provide the advanced/delayed pre-distortion signals corresponding to $I_1$, $Q_1$ and $I_2$, $Q_2$ in FIG. 7. Vector modulator 908 is configured such that, in the absence of control signal inputs, the RF signal passes through without (or with minimal) distortion, whereas vector modulators 912 and 916 are configured such that, in the absence of control signal inputs, little or no RF signal passes through. Thus, when control signals are applied, vector modulator 908 produces the original RF signal plus a pre-distortion signal, whereas vector modulators 912 and 916 produce essentially pre-distortion signals only.

Delay blocks 920 and 922 in FIG. 9 are analogous to delay blocks 706 and 708 in FIG. 7, while delay blocks 1002 and 1004 in FIG. 10 are analogous to delay blocks 802 and 804 in FIG. 8. In both FIGS. 9 and 10, the resulting main pre-distorted signal and additional frequency-dependent phase pre-distortion signals are combined together by an RF combiner 924, where the combined signal constitutes the RF output signal that is applied to the amplifier.

Since, in these RF implementations, the input signal is pre-distorted in the RF domain, a modulator similar to IQ modulator 14 of FIG. 1 may be omitted. In other implementations in which the input signal is pre-distorted at a lower frequency (e.g., in the IF domain), a mixer would be needed to convert the resulting pre-distorted IF signal to the RF domain prior to being applied to the amplifier.

Figure 11:
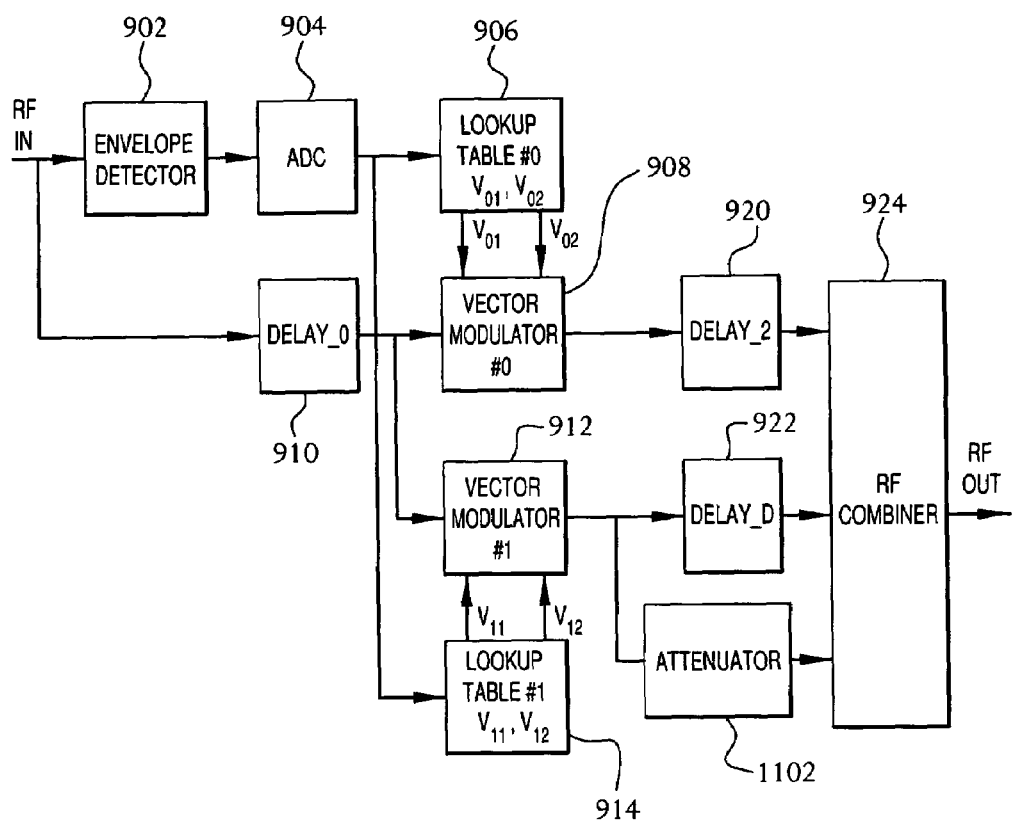
FIGS. 11 and 12 show block diagrams of alternative implementations of the RF-based pre-distorters of FIGS. 9 and 10, respectively.
Figure 12:
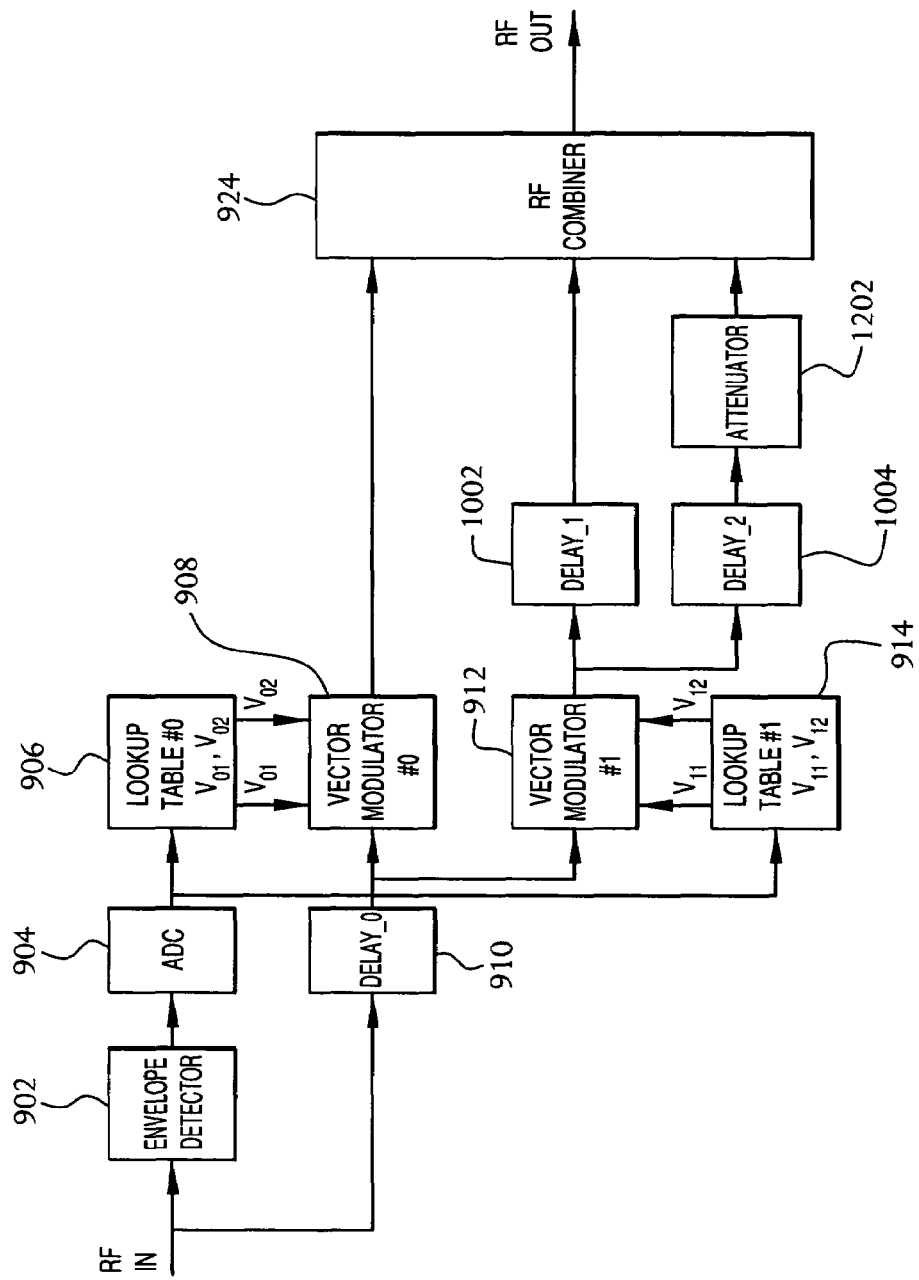

In some cases, it is found that the contents of look-up table 918 can be approximated by the contents of look-up table 914, multiplied by a constant. In such cases, the RF implementations of FIGS. 9 and 10 can be simplified as shown in FIGS. 11 and 12. According to these implementations, vector modulator 916 and its associated look-up table 918 may be eliminated, with the output of vector modulator 912 being split into two paths, one of which is attenuated relative to the other by an attenuator (1102 in FIG. 11 and 1202 in FIG. 12). In FIGS. 11 and 12, the attenuator is placed in the paths shown when the value of the constant relating the values in look-up table 918 to the values in look-up table 914 of FIGS. 9 and 10 is less than one. When the value of the constant is greater than one, an attenuator is preferably placed in the other path. As with FIGS. 9 and 10, the two configurations shown in FIGS. 11 and 12 produce similar results when the pre-distortion parameters in look-up table 914 of one configuration have the opposite sign as the pre-distortion parameters in the corresponding look-up table of the other configuration.

Correction Using Fixed Look-Up Tables

The frequency-independent pre-distortion processing of the '490 application may be said to handle AM-to-AM and AM-to-PM "memory-less" distortion correction, while the frequency-dependent correction of the '343 application can be used to correct for "memory effects" in an amplifier. FIG. 2 shows an example of frequency-independent pre-distortion processing. Similarly, look-up table 30 and module 36 of FIG. 5 correspond to frequency-independent pre-distortion processing, while look-up table 502 and module 504 of FIG. 5 correspond to frequency-dependent pre-distortion processing.

For a UMTS-band amplifier, power typically varies over a relatively broad dynamic range, such as 20–50 dBm, and temperature varies over a relatively wide range, such as 0 to 55 degrees C. One way to handle the affects to an amplifier's performance characteristics resulting from such changes in operating conditions is to update the look-up tables used for pre-distortion processing, either periodically or as needed. One technique for updating a look-up table (e.g., LUT 30 of FIGS. 2 and 5 or LUT 502 of FIG. 5) is to down-convert and digitize the two signals input to and output from the amplifier, perform a bit-level comparison, and update the look-up table as the amplifier's operating characteristics change due to outside factors such as temperature, operating power, peak-to-average signal power, and bias drift. The present section describes a technique for performing pre-distortion processing without updating the look-up tables (i.e., using fixed LUTs), even when such characteristics as the average operating power or operating temperature of the amplifier change over time.

According to preferred embodiments, pre-distortion processing is implemented in the face of changing operating conditions by controlling three types of parameters: biases of the class AB amplifier stages, the overall insertion gain of the amplifier, and offset pointer applied to the index function of the look-up tables. Although each of these types of parameters can be controlled independently of each other, improved performance can be achieved when all three are iteratively adapted as a group.

After presetting the parameters proposed for use in controlling the amplifier to known good values, the look-up tables can be derived by training the amplifier. This training involves an adaptive routine in which the two signals input to and output from the amplifier are down-converted, digitized, and compared using a bit-level comparison, where the LUT entries are updated based on the error observed between the two samples.

Once the amplifier has been trained, the look-up tables can be held constant from that point in time for the life of the amplifier, by appropriately modifying one or more (and preferably all three) of the earlier-mentioned control parameter types inside the amplifier to keep the amplifier's characteristics matched to the LUTs. In other words, this technique adapts the amplifier in order to keep using fixed look-up tables, while other approaches adapt the LUTs to match a changing amplifier.

Figure 13:
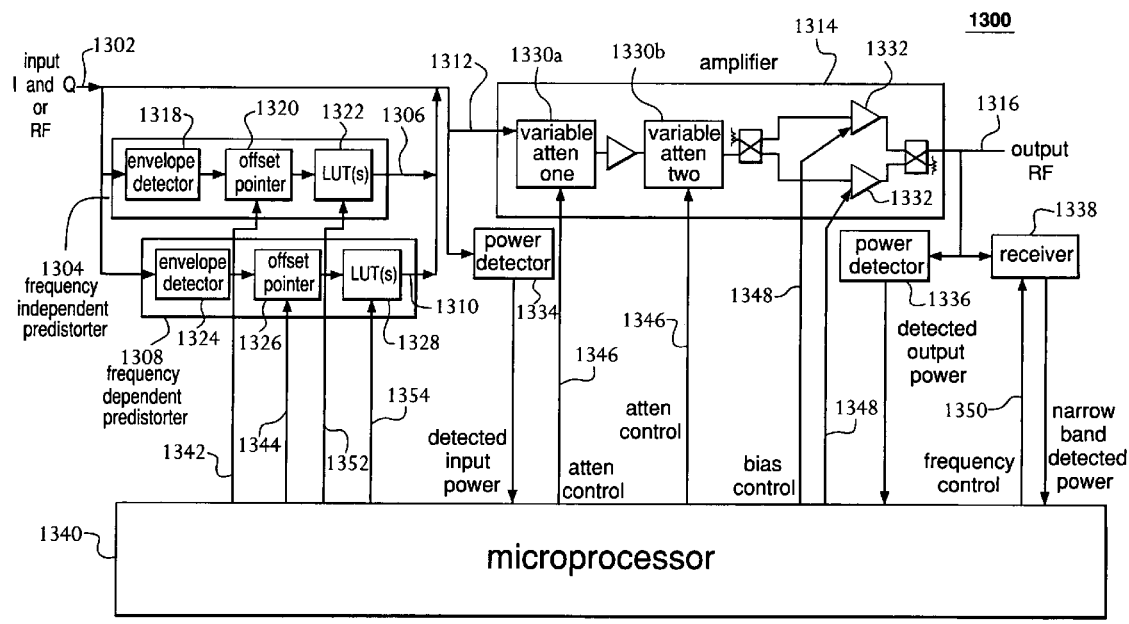
FIG. 13 shows a high-level block diagram of an amplifier system that employs fixed look-up tables.

FIG. 13 shows a high-level block diagram of an amplifier system 1300, which employs fixed frequency-independent and frequency-dependent look-up tables. Depending on the particular implementation, amplifier system 1300 receives either a base-band input signal represented by digital I and Q values or an analog RF input signal. In either case, frequency-independent pre-distorter 1304 generates frequency-independent pre-distortion components 1306 and frequency-dependent pre-distorter 1308 generates frequency-dependent pre-distortion components 1310, both of which are combined with input signal 1302 to generate a pre-distorted input signal 1312, which is applied to amplifier 1314 to generate an amplified output signal 1316.

In particular, envelope detector 1318 of frequency-independent pre-distorter 1304 measures the power of input signal 1302. Depending on the particular implementation, envelope detector 1318 may be similar to index-calculating module 28 of FIG. 2 or envelope detector 902 of FIG. 9. The detected power level is applied to offset pointer module 1320, which adds an appropriate offset value to the detected power level. The resulting offset power level is then used as an index into one or more frequency-independent LUTs 1322 to retrieve one or more frequency-independent pre-distortion parameters (e.g., A and B of FIG. 5). These frequency-independent pre-distortion parameters are then applied within pre-distorter 1304 to generate frequency-independent pre-distortion components 1306.

Similarly, envelope detector 1324 of frequency-dependent pre-distorter 1308 measures the power of input signal 1302. Depending on the particular implementation, two separate envelope detectors or a single, shared envelope detector can be used for envelope detector 1318 and envelope detector 1324. The detected power level is applied to offset pointer module 1326, which adds an appropriate offset value to the detected power level. The resulting offset power level is then used as an index into one or more frequency-dependent LUTs 1328 to retrieve one or more frequency-dependent pre-distortion parameters (e.g., X and Y of FIG. 5). These frequency-dependent pre-distortion parameters are then applied within pre-distorter 1308 to generate frequency-dependent pre-distortion components 1310.

Among other components, amplifier 1314 has one or more variable attenuators 1330 that are used to control the overall insertion gain of the amplifier. In addition, amplifier 1314 has one or more class AB amplifier stages 1332 whose operations are at least partially controlled based on applied bias voltages.

As shown in FIG. 13, amplifier system 1300 also has power detectors 1334 and 1336, receiver 1338, and controller (e.g., microprocessor) 1340. Frequency-independent pre-distorter 1304 may be said to be analogous to frequency-independent pre-distorter 12 and IQ modulator 14 of FIG. 1; amplifier 1314 may be said to be analogous to amplifier 16 of FIG. 1; and receiver 1338 and microprocessor 1340 may be said to be analogous to receiver 18 of FIG. 1 and processing module 32 of FIG. 2, all of the '490 application, while frequency-dependent pre-distorter 1308 may be said to be analogous to the frequency-dependent pre-distortion components of the '343 application described in FIGS. 5–12.

Power detectors 1334 and 1336 are preferably wide-band power detectors, while receiver 1338 functions as a narrow-band, frequency-selective power detector that is able to sequentially detect narrow-band power at a variety of different selected frequencies, similar to that described previously in the context of FIG. 4. As shown, power detector 1334 measures the wide-band power of the pre-distorted input signal 1312, and power detector 1336 measures the wide-band power of the amplified output signal 1316, while receiver 1338 measures narrow-band power of the amplified output signal 1316 at a selected frequency. Based on the amplifier architecture, the placement of input power detector 1334 may be moved to any point between the input at 1302 and first attenuator 1330a with virtually the same results.

Microprocessor 1340 receives and processes these different measured power levels to control the operations of amplifier system 1300. In particular, microprocessor 1340 generates an offset pointer control signal 1342 to control the value of the offset pointer applied by module 1320 as well as an offset pointer control signal 1344 to control the value of the offset pointer applied by module 1326. In addition, microprocessor 1340 generates attenuation control signals 1346 to control the level of attenuation applied by attenuator(s) 1330, thereby controlling the overall insertion gain of amplifier 1314. Microprocessor 1340 also generates one or more bias control signals 1348 to control the bias voltage levels applied to amplifier stage(s) 1332. Furthermore, microprocessor 1340 generates a frequency control signal 1350 to select the frequency at which receiver 1338 measures narrow-band power.

Figure 14A:
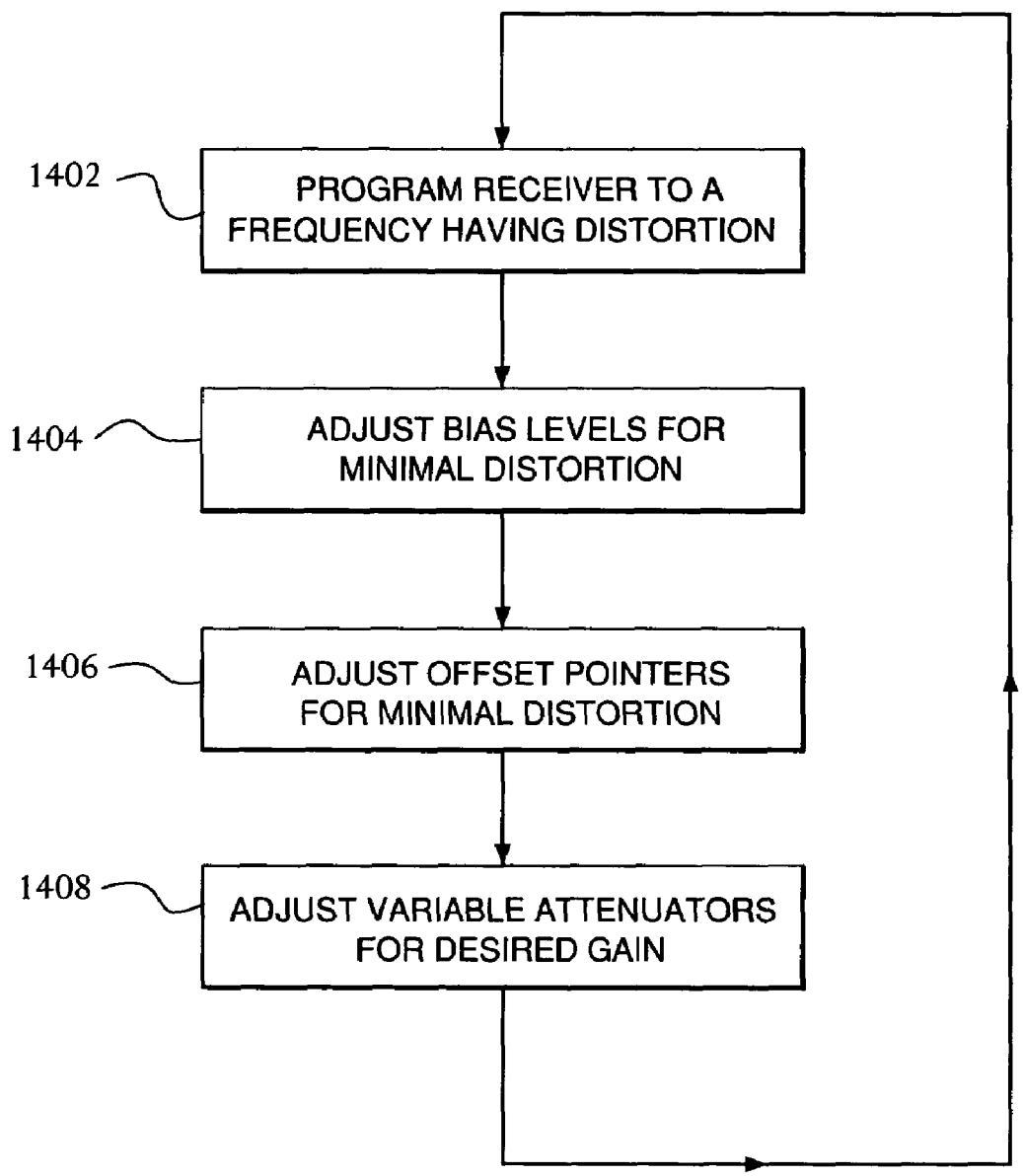
FIGS. 14A–B shows high-level flow diagrams of exemplary iterative control processing implemented in the amplifier system of FIG. 13 to control the offset pointer(s), variable attenuator(s), and amplifier stage bias level(s)

FIG. 14A shows a high-level flow diagram of exemplary iterative control processing implemented in by microprocessor 1340 of amplifier system 1300 of FIG. 13 to control the amplifier stage bias level(s), LUT offset pointer(s), and variable attenuator(s) in order to perform pre-distortion processing using fixed LUTs. In one implementation, the frequency-independent and frequency-dependent LUTs are optimized during amplifier production and then never adjusted thereafter, even in the face of changing operating characteristics of the amplifier.

The primary way to detect if the characteristics of amplifier 1314 still match the look-up tables is by monitoring the output spectrum of the amplifier using narrow-band, frequency-selective receiver 1338, where microprocessor 1340 generates frequency control signal 1350 to program receiver 1338 to a frequency that contains distortion (step 1402 of FIG. 14A). Note that more than one frequency can be sequentially monitored. Ideally, each selected frequency would have zero power. Non-zero power levels at these frequencies indicates the presence of distortion.

The first control parameter type that is adapted corresponds to the bias levels of class AB stages 1332. In particular, microprocessor 1340 generates bias control signal(s) 1348 to adjust the bias voltage levels applied to amplifier stage(s) 1332 to minimize the distortion measured by receiver 1338 (step 1404). Each class AB stage's bias can preferably be controlled independently of each other. One at a time, they may be adjusted up or down a small amount while monitoring the output spectrum of the pre-distorted amplifier to find the best setting. Note that this process is not necessarily intended to find the best setting for efficiency, peak power, or linearity. Rather, the goal is to find the setting that keeps the performance of the amplifier as close as possible to what it was when the amplifier was trained. Adjustment of the class AB bias point is preferably controlled with D/A converters (not shown in FIG. 13).

The next control parameter type that is adapted corresponds to the offset pointers applied to the indexing functions of the look-up tables. In particular, microprocessor 1340 generates offset pointer control signal 1342 to adjust the offset point applied by module 1320 as well as offset pointer control signal 1344 to adjust the offset point applied by module 1326 to minimize distortion as measured by receiver 1338 (step 1406). These offset pointers effectively allow the look-up tables to be shifted up or down with respect to envelope power. Again, the offset pointers may be adjusted up or down a small amount while monitoring the output spectrum of the pre-distorted amplifier.

Depending on the implementation, an offset pointer can be applied on an RF signal with a variable RF attenuator (placed, for instance, in front of element 902 in FIG. 9), or applied on a low-frequency signal that represents the envelope by manipulating a gain value with an op amp circuit (placed, for instance, right before element 904 in FIG. 9), or applied in firmware or software as an addition or subtraction to a number (for instance, right after element 28 in FIG. 5, or after element 904 in FIG. 9).

The third parameter that is adapted is the gain setting of an automatic gain control (AGC) loop. In particular, microprocessor 1340 uses the amplifier input and output power levels detected by broad-band detectors 1334 and 1336 to generate attenuation control signal(s) 1346 to adjust variable attenuator(s) 1330 for a desired level of insertion gain (step 1408). The AGC loop helps to compensate for any gain shift that occurs from adjusting the bias levels of the class AB stages and/or when offsetting the indices of the look-up tables.

Depending on the implementation, a variable attenuator can be implemented in hardware with RF circuitry (for instance, anywhere in the RF path of FIG. 9), or implemented in hardware on I and Q voltage signals before they are applied to a modulator (for instance, right before or after element 34 of FIG. 2), or applied in firmware or software as a manipulation of the I and Q values (for instance, manipulating the values of A and B shown between blocks 30 and 36 of FIG. 2, or by manipulating the output values $V_{O1}$ and $V_{O2}$ of element 906 in FIG. 9.)

Processing then returns to step 1402 for another iteration of this control processing.

The feedback mechanism used for adaptation can be the same as that described earlier for the '490 application. Alternative feedback can be provided by comparing the I and Q bit stream at the output of the amplifier with the bit stream at the input of the amplifier, using the residual error after correlating the two signals as the feedback information.

The combination of adjusting these three controls types results in very constant amplifier performance over operating power and temperature, allowing the use of fixed look-up tables. One explanation of how this works is based on a large shift in temperature of the amplifier. The gain of each of the amplifier stages will shift quite a bit when the temperature of the amplifier changes, e.g., from room temperature to 0 degrees C. The AGC circuit returns the overall gain to the correct value. But even with the AGC loop setting the overall gain correctly, the gain distribution will have shifted among the cascaded stages, and the cascaded line-up performance would now be different. For example, when cold, the gain of an amplifier stage typically goes up. When the gain of the final stage goes up, the pre-final stage's output power goes down. Hence, there is a different contribution to the overall distortion from the pre-final stage.

This is addressed in two ways. The first way is to offset the index pointers to the look-up tables. This can compensate for some shifts in the performance by driving the amplifier either farther or not as far into compression.

A second way is to change the bias levels of the two class AB final devices. In the preferred approach, these devices are operated in a balanced configuration. By taking one device's bias up slightly and the other device's bias down slightly, the gain of the final stage can be changed a small amount. This is due to changes in the insertion gain and insertion phase of the two paths of the balanced pair, which impacts the combining efficiency. Changing the bias of both devices up or down together can also change the gain of the final stage. Changing the bias in the manner described also impacts the overall insertion phase of the final stage. Finally, changing the bias point of the two devices up or down will impact the linearity of the devices, or more specifically, the distortion characteristics of the two devices.

In cases where the gain of the final stage goes up or down due to a change in bias point, but the characteristics are better matched to the look-up tables, the AGC operation compensates by bringing the gain back to the nominal value, allowing the better bias point (with respect to amplifier characteristics vs. the look-up table) to be used.

In cases where the shape of the characteristics are better matched to the look-up tables, but there are offsets between the look-up tables and the amplifier, the offset index pointers compensate by shifting the index points of the look-up tables, allowing the better bias point (with respect to amplifier characteristics vs. the look-up table) to be used. Similar redistribution of the gain between stages can be accomplished with additional variable attenuators placed in the lineup, or by the use of variable gain stages.

The combination of the above results in amplifier characteristics that are held very constant over temperature and operating power.

Figure 14B:
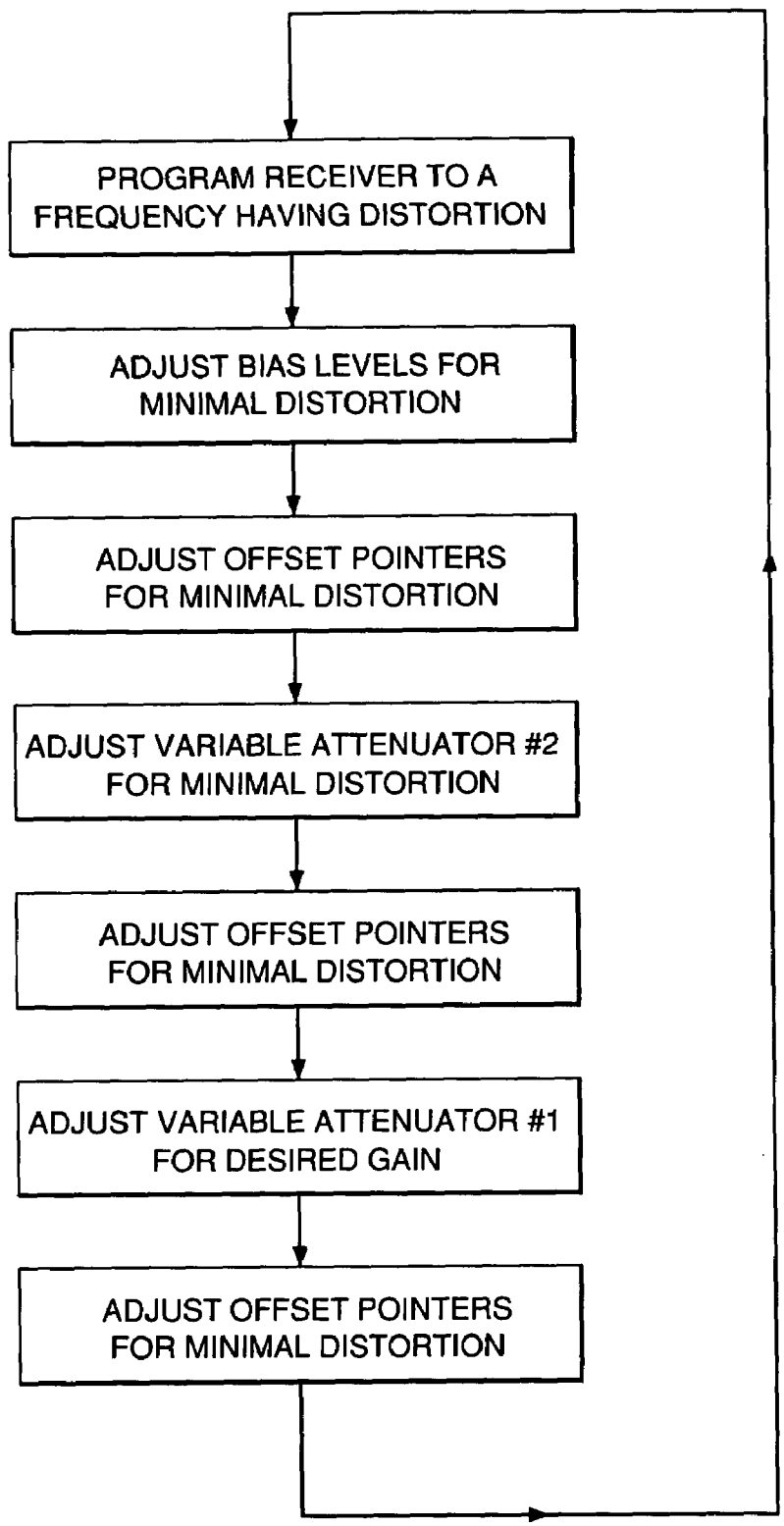

Although the iterative control processing has been shown in the context of FIG. 14A in which bias levels are first adjusted, then offset pointers, then the variable attenuators, the control processing can alternatively be implemented using any other suitable order. A more optimal order may be, for example, to (1) re-adjust the offset pointers more often and (2) adjust one or more attenuators (e.g., 1330b of FIG. 13) to minimize distortion, while (3) adjusting other attenuators (e.g., 1330a of FIG. 13) to control the overall insertion gain of the amplifier, as shown in FIG. 14B.

Updating Pre-Distortion Look-Up Tables

As described previously, pre-distortion processing can be implemented by retrieving pre-distortion parameters from one or more look-up tables and using those retrieved pre-distortion parameters to generate pre-distortion components.

This section describes a technique for updating a look-up table to compensate for changes in the operating characteristics of an amplifier such as those due to changes in operating power and/or temperature. Depending on the particular implementation, this LUT update processing may be applied to one or both of frequency-independent LUTs and frequency-dependent LUTs.

As a particular example, Equations (12) and (13) presented polynomial equations for generating frequency-dependent pre-distortion parameters X and Y. These equations can be extended to include higher-order terms according to exemplary Equations (15) and (16) as follows:

$$X = C_0 + C_{10}P + C_{12}P^2 \quad (15)$$

$$Y = C_0 + C_{11}P + C_{13}P^2 \quad (16)$$

where P is the power of the input signal, and $C_0$, $C_{10}$, $C_{11}$, $C_{12}$, and $C_{13}$ are specified parameter values, where $C_0$ is an offset value that can be used to center the look-up table about a specified range.

Figure 15:
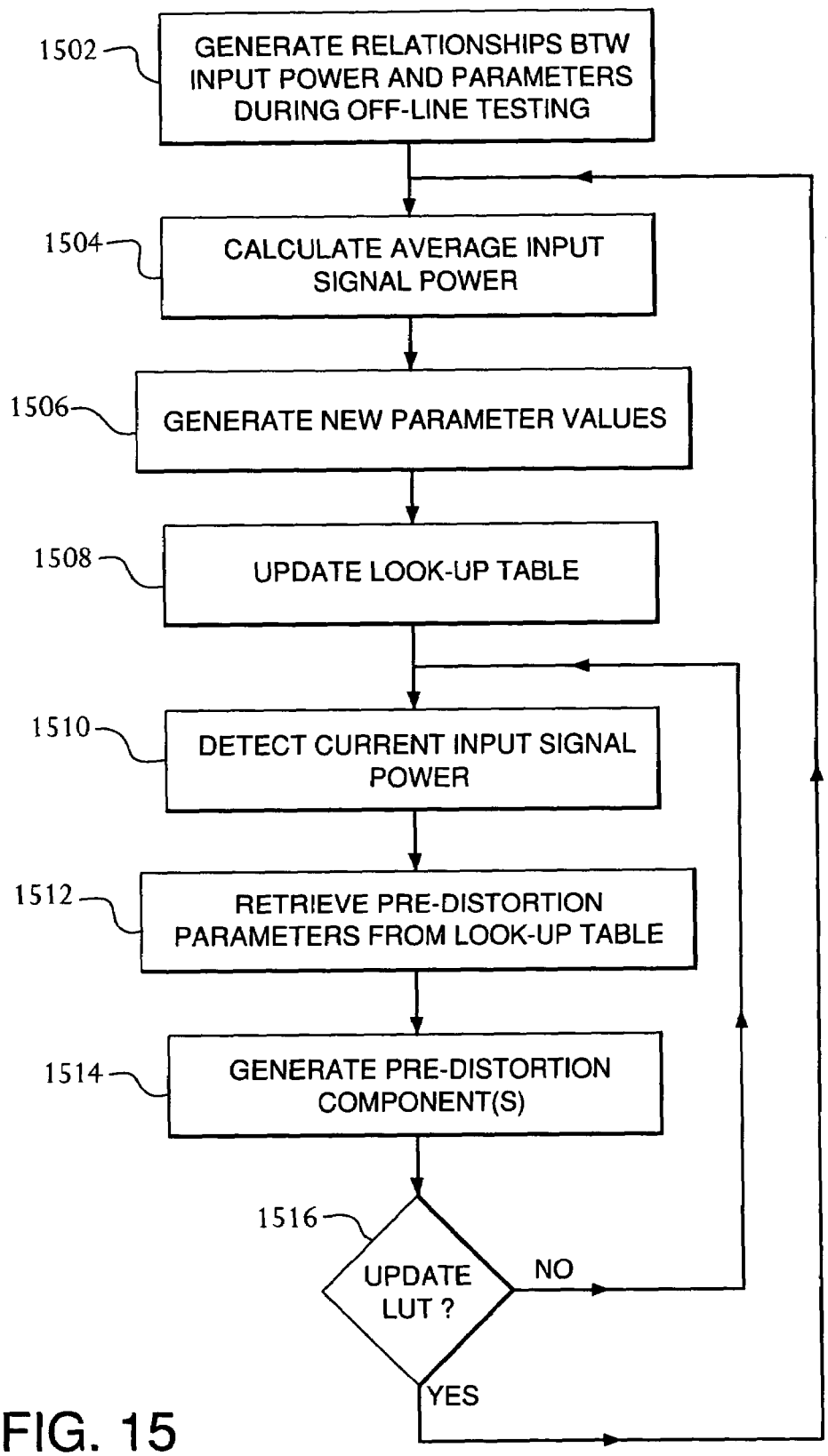
FIG. 15 shows a flow diagram of one embodiment of pre-distortion processing.

FIG. 15 shows a flow diagram of one embodiment of frequency-dependent pre-distortion processing. In particular, off-line testing is used to determine optimal values of the parameters $C_{10}$, $C_{11}$, $C_{12}$, and $C_{13}$ over the expected range of input signal power levels (step 1502 of FIG. 15). For an exemplary amplifier system, for each of a number of different input signal power levels between about 30 dBm and about 47 dBm, testing is performed to determine the values of the parameters $C_{10}$, $C_{11}$, $C_{12}$, and $C_{13}$ that generate frequency-dependent pre-distortion parameters X and Y that produce pre-distorted input signals that minimize the resulting distortion in the amplified output signals.

Figure 16:
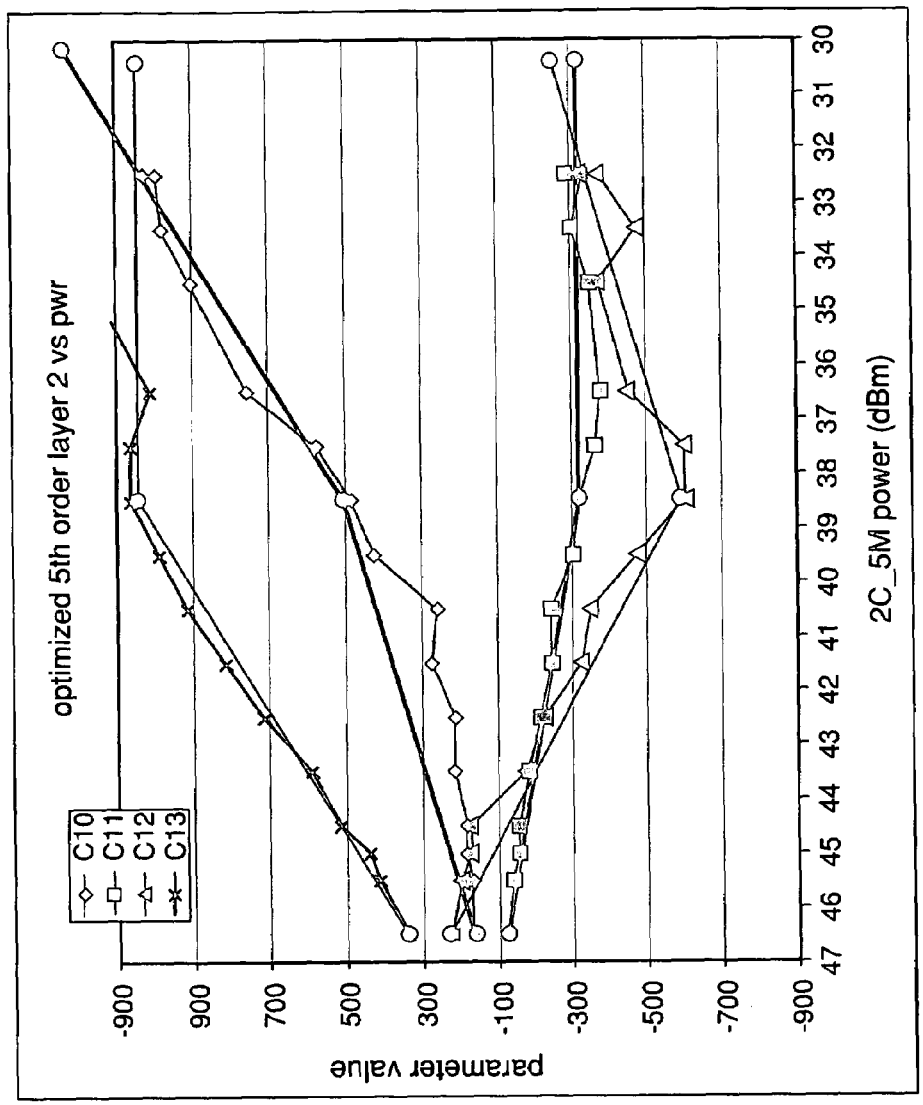
FIG. 16 shows a graphical representation of the values of the parameters $C_{10}$, $C_{11}$, $C_{12}$, and $C_{13}$ as a function of input signal power for an exemplary amplifier system.

FIG. 16 shows a graphical representation of these values of the parameters $C_{10}$, $C_{11}$, $C_{12}$, and $C_{13}$ as a function of input signal power for the exemplary amplifier system. Also shown in FIG. 16 are the results of linear curve-fitting in which the relationship between each parameter and the input signal power is approximated by a piece-wise linear curve.

During real-time operations, the average input signal power is calculated and then used to update one or more of the frequency-dependent look-up tables. In particular, the current average input signal power is generated, e.g., by averaging the instantaneous detected power levels over a specified sample interval (e.g., 100 msec) (step 1504 of FIG. 15). The average input signal power is then applied to algebraic representations of the piece-wise linear curves shown in FIG. 16 to generate new values for the parameters $C_{10}$, $C_{11}$, $C_{12}$, and $C_{13}$ (step 1506). These values are then used to generate new look-up table entries, e.g., using Equations (15) and (16) (step 1508). Using the detected current input signal power (step 1510) as an index, the one or more updated look-up tables are then used to retrieve the frequency-dependent pre-distortion parameters (e.g., X and Y) (step 1512). These retrieved pre-distortion parameters are then used to generate one or more frequency-dependent pre-distortion components (step 1514) that are combined with the input signal and frequency-independent pre-distortion components to generate a pre-distorted input signal that is applied to the amplifier.

Depending on the particular implementation, the frequency-dependent LUT(s) can be updated (step 1516) periodically (e.g., 10–20 times per second) or when appropriate (e.g., when average input signal power has changed by a specified amount since the last update or when one of the four parameter values has changed by a specified amount since the last update or when the linearity of the output spectrum has degraded beyond an acceptable level).

Although this technique has been described for updating frequency-dependent LUTs using Equations (15) and (16), which are second-order equations of the input signal power level, alternative versions of this technique are possible. For example, other higher- or lower-order equations could be used, and/or the equations could include alternative or additional parameters other than average input signal power level, such as peak input signal power level, average or peak current draw, average or peak output signal power level, number of traffic channels in the signal, temperature, operating frequency, etc. Although the relationship between average input signal power and the parameters $C_{10}$, $C_{11}$, $C_{12}$, and $C_{13}$ is approximated using piecewise linear curves, in alternative implementations, other relationships could be used, including higher-order (i.e., non-linear) curves or even look-up tables. The technique described for updating frequency-dependent LUTs can also be applied to update frequency-independent LUTs.

In addition to adjusting the frequency-dependent LUT(s) based on average input signal power in the above-described open-loop manner, the parameters that determine the frequency-dependent LUT(s) (e.g., $C_{10}$, $C_{11}$, $C_{12}$, and $C_{13}$) can also be adjusted to adapt to the actual output spectrum (or linearity) of the amplifier. For example, referring to amplifier system 1300 of FIG. 13, receiver 1338 can be used to detect narrow-band power at a sequence of selected frequencies in amplified output signal 1316 to characterize the output spectrum. The parameters can then be adjusted to minimize spurious emissions, as described in the '490 application, using the modified Simplex algorithm. This adaptation allows optimization of LUTs, correcting for errors introduced by using a piecewise linear curve to map the variables to input power and adapting for subtle changes in amplifier characteristics due to changes in temperature, frequency of operation, and/or signal cumulative distribution function.

Hybrid Implementations

With reference to FIGS. 1 and 2, the earlier section entitled "Pre-Distortion Technique of the '490 Application" contains a description of a feedback-based (i.e., closed-loop) LUT update technique that is based on a narrow-band receiver and the modified Simplex algorithm. The previous section entitled "Updating Pre-Distortion Look-Up Tables" describes an open-loop technique for updating LUTs based on, for example, the average input signal power level. The section before that, entitled "Correction Using Fixed Look-Up Tables," describes a technique for performing pre-distortion correction using fixed LUTs. Two or more of these techniques can be advantageously combined in a particular implementation.

In particular, one or more of these techniques can be applied to frequency-independent LUTs, while a different set of one or more techniques are applied to frequency-dependent LUTs. For example, the frequency-independent LUTs can be controlled using fixed LUTs, while the frequency-dependent LUTs are controlled using open-loop adaptation. At the same time that these LUTs are being modified, the performance of the amplifier system can continue to be optimized by adjusting one or more of the envelope detector offsets, the amplifier gain, and the class AB bias levels. The (closed-loop and/or open-loop) modifications to the LUTs are represented in FIG. 13 by control signals 1352 and 1354.

Alternative Embodiments

Depending on the particular application, the configurations shown in FIGS. 5–13 can be implemented in the context of circuitry that includes modules analogous to equalization filter 20, clipping module 22, low-pass filter 24, and sampling module 26 of FIG. 2. In alternative implementations, one or more—and even all—of these components may be omitted and/or one or more other processing components may be included, depending on the characteristics of the input signals and the requirements of the particular communication network.

Implementations have been described in the context of configurations in which frequency-dependent phase pre-distortion is combined with the (frequency-independent) magnitude and phase pre-distortion of the '490 application. It is possible to perform frequency-dependent phase pre-distortion without performing the pre-distortion of the '490 application. In that case, the configuration shown in FIG. 5, for example, could be modified by omitting look-up table 30 and output module 36 and passing a copy of the delayed input signal from delay block 34 directly to delay block 506, while retaining the processing of look-up table 502 and module 504.

Implementations have been described in the context of wireless signals transmitted from a base station to one or more mobile units of a wireless communication network. In theory, embodiments could be implemented for wireless signals transmitted from a mobile unit to one or more base stations. Embodiments can also be implemented in the context of other wireless and even wired communication networks to reduce spurious emissions.

Embodiments may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

Embodiments can be embodied in the form of methods and apparatuses for practicing those methods. Embodiments can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. Embodiments can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method for processing an input signal for application to an amplifier to generate an amplified output signal, comprising:
   generating an index into a look-up table based on the input signal;
   adjusting the index to compensate for changes in operating characteristics of the amplifier over time;
   retrieving one or more pre-distortion parameters from the look-up table based on the adjusted index; and
   pre-distorting the input signal based on the one or more pre-distortion parameters to generate a pre-distorted input signal for application to the amplifier, wherein:
   the index is adjusted based on a measure of distortion in the amplified output signal; and
   the measure of distortion is based on a narrow-band power level in the amplified output signal.

2. The method of claim 1, further comprising amplifying the pre-distorted input signal with the amplifier to generate the amplified output signal.

3. The method of claim 2, wherein amplifying the pre-distorted input signal comprises controlling overall gain of the amplifier to compensate for the changes in the operating characteristics of the amplifier.

4. The method of claim 3, wherein the overall gain is controlled based on a comparison of power of the pre-distorted input signal and power of the amplified output signal.

5. The method of claim 3, wherein the overall gain is controlled to keep the overall gain substantially constant over time.

6. The method of claim 5, wherein the overall gain is further controlled to reduce distortion in the amplified output signal.

7. The method of claim 3, wherein the overall gain is controlled to reduce distortion in the amplified output signal.

8. The method of claim 3, wherein amplifying the pre-distorted input signal further comprises controlling bias applied to one or more amplifier stages of the amplifier.

9. The method of claim 8, wherein the bias is controlled based on a measure of distortion in the amplified output signal.

10. The method of claim 9, wherein the measure of distortion is based on a narrow-band power level in the amplified output signal.

11. The method of claim 2, wherein amplifying the pre-distorted input signal comprises controlling bias applied to one or more amplifier stages of the amplifier.

12. The method of claim 11, wherein the bias is controlled based on a measure of distortion in the amplified output signal.

13. The method of claim 12, wherein the measure of distortion is based on a narrow-band power level in the amplified output signal.

14. The method of claim 1, wherein the look-up table corresponds to frequency-independent pre-distortion processing.

15. The method of claim 1, wherein the look-up table corresponds to frequency-dependent pre-distortion processing.

16. The method of claim 1, further comprising:
retrieving one or more other pre-distortion parameters from a different look-up table based on the input signal; and
pre-distorting the input signal based on the one or more other pre-distortion parameters to generate a different pre-distortion component for the pre-distorted input signal, wherein the different look-up table is automatically updated by:
generating a measure based on current operations of the amplifier;
applying the measure to one or more algebraic equations to generate one or more parameter values; and
applying the one or more parameter values to one or more polynomials to update the different look-up table.

17. The method of claim 1, wherein the look-up table is automatically updated by:
generating a measure based on current operations of the amplifier;
applying the measure to one or more algebraic equations to generate one or more parameter values; and
applying the one or more parameter values to one or more polynomials to update the look-up table.

18. The method of claim 1, wherein the look-up table is generated during training of the amplifier and always kept fixed after training is complete.

19. The method of claim 1, wherein the index is based on power of the input signal.

20. Apparatus for processing an input signal for application to an amplifier to generate an amplified output signal, comprising:
an index generator adapted to generate an index into a look-up table based on the input signal;
an index adjuster adapted to adjust the index to compensate for changes in operating characteristics of the amplifier over time;
the look-up table adapted to provide one or more pre-distortion parameters based on the adjusted index; and
a pre-distorter adapted to pre-distort the input signal based on the one or more pre-distortion parameters to generate a pre-distorted input signal for application to the amplifier, wherein:
the index adjuster is adapted to adjust the index based on a measure of distortion in the amplified output signal; and
the measure of distortion is based on a narrow-band power level in the amplified output signal.

21. The apparatus of claim 20, further comprising the amplifier adapted to amplify the pre-distorted input signal to generate the amplified output signal.

22. The apparatus of claim 21, wherein the amplifier is adapted to control overall gain of the amplifier to compensate for the changes in the operating characteristics of the amplifier.

23. The apparatus of claim 22, wherein the amplifier is adapted to control the overall gain based on a comparison of power of the pre-distorted input signal and power of the amplified output signal.

24. The apparatus of claim 22, wherein the amplifier is adapted to control the overall gain to keep the overall gain substantially constant over time.

25. The apparatus of claim 24, wherein the overall gain is further controlled to reduce distortion in the amplified output signal.

26. The apparatus of claim 22, wherein the overall gain is controlled to reduce distortion in the amplified output signal.

27. The apparatus of claim 22, wherein the amplifier is further adapted to control bias applied to one or more amplifier stages of the amplifier.

28. The apparatus of claim 27, wherein the amplifier is adapted to control the bias based on a measure of distortion in the amplified output signal.

29. The apparatus of claim 28, wherein the measure of distortion is based on a narrow-band power level in the amplified output signal.

30. The apparatus of claim 21, wherein the amplifier is adapted to control bias applied to one or more amplifier stages of the amplifier.

31. The apparatus of claim 30, wherein the amplifier is adapted to control the bias based on a measure of distortion in the amplified output signal.

32. The apparatus of claim 31, wherein the measure of distortion is based on a narrow-band power level in the amplified output signal.

33. The apparatus of claim 21, further comprising:
a first power detector adapted to detect power of the pre-distorted input signal;
a second power detector adapted to detect power of the amplified output signal;
a receiver adapted to detect narrow-band power of the amplified output signal at a selected frequency; and
a controller adapted to process the detected powers from the first and second power detectors and from the receiver to generate one or more control signals used to control operations within the apparatus.

34. The apparatus of claim 33, wherein the one or more control signals control the index adjuster, a variable attenuator in the amplifier, and bias levels applied to one or more amplifier stages in the amplifier.

35. The apparatus of claim 33, wherein the first and second power detectors are wide-band power detectors.

36. The apparatus of claim 33, wherein the controller is adapted to change the selection of the frequency of the receiver.

37. The apparatus of claim 20, wherein the look-up table corresponds to frequency-independent pre-distortion processing.

38. The apparatus of claim 20, wherein the look-up table corresponds to frequency-dependent pre-distortion processing.

39. The apparatus of claim 20, further comprising:
a different look-up table adapted to provide one or more other pre-distortion parameters based on the input signal, wherein the pre-distorter is further adapted to pre-distort the input signal based on the one or more other pre-distortion parameters to generate a different pre-distortion component for the pre-distorted input signal; and
a controller adapted to automatically update the different look-up table by:

generating a measure based on current operations of the amplifier;

applying the measure to one or more algebraic equations to generate one or more parameter values; and applying the one or more parameter values to one or more polynomials to update the different look-up table.

40. The apparatus of claim 20, further comprising a controller adapted to automatically update the look-up table by:

generating a measure based on current operations of the amplifier;

applying the measure to one or more algebraic equations to generate one or more parameter values; and applying the one or more parameter values to one or more polynomials to update the look-up table.

41. The apparatus of claim 20, wherein the look-up table is generated during training of the amplifier and always kept fixed after training is complete.

42. The apparatus of claim 20, wherein the index is based on power of the input signal.

43. A method for processing an input signal for application to an amplifier to generate an amplified output signal, comprising:

retrieving one or more pre-distortion parameters from a look-up table based on the input signal; and pre-distorting the input signal based on the one or more pre-distortion parameters to generate a pre-distorted input signal for application to the amplifier, wherein the look-up table is automatically updated by:

generating a measure based on current operations of the amplifier;

applying the measure to one or more algebraic equations to generate one or more parameter values; and applying the one or more parameter values to one or more polynomials to update the look-up table.

44. The method of claim 43, wherein the measure is average power of the input signal.

45. The method of claim 43, wherein each algebraic equation is a piecewise linear curve.

46. The method of claim 43, wherein:

the measure is applied to four algebraic equations to generate four parameter values; and the four parameter values are applied to two second-order polynomials to update two pre-distortion parameters in the look-up table.

47. The method of claim 43, wherein the pre-distortion parameters are frequency-dependent pre-distortion parameters.

48. The method of claim 43, wherein the pre-distortion parameters are frequency-independent pre-distortion parameters.

49. The method of claim 43, wherein the look-up table is updated at a specified periodic rate.

50. The method of claim 43, wherein the look-up table is updated based on a detected change in operating conditions of the amplifier.

51. The method of claim 50, wherein the detected change in the amplifier operating conditions corresponds to a change in a parameter value greater than a specified threshold value.

52. The method of claim 43, wherein the one or more parameter values are fine-tuned based on output spectrum of the amplifier.

53. Apparatus for processing an input signal for application to an amplifier to generate an amplified output signal, comprising:

a look-up table adapted to provide one or more pre-distortion parameters based on the input signal;

a pre-distorter adapted to pre-distort the input signal based on the one or more pre-distortion parameters to generate a pre-distorted input signal for application to the amplifier; and a controller adapted to automatically update the look-up table by:

generating a measure based on current operations of the amplifier;

applying the measure to one or more algebraic equations to generate one or more parameter values; and applying the one or more parameter values to one or more polynomials to update the look-up table.

54. The apparatus of claim 53, wherein:

the measure is average power of the input signal; and further comprising an envelope detector adapted to detect current power of the input signal, wherein the controller uses the current input signal power to generate the average input signal power.

55. The apparatus of claim 53, wherein each algebraic equation is a piecewise linear curve.

56. The apparatus of claim 53, wherein:

the controller is adapted to apply the measure to four algebraic equations to generate four parameter values; and the controller is adapted to apply the four parameter values to two second-order polynomials to update two pre-distortion parameters in the look-up table.

57. The apparatus of claim 53, wherein the pre-distortion parameters are frequency-dependent pre-distortion parameters.

58. The apparatus of claim 53, wherein the pre-distortion parameters are frequency-independent pre-distortion parameters.

59. The apparatus of claim 53, wherein the controller is adapted to update the look-up table at a specified periodic rate.

60. The apparatus of claim 53, wherein the controller is adapted to update the look-up table based on a detected change in operating conditions of the amplifier.

61. The apparatus of claim 60, wherein the detected change in the amplifier operating conditions corresponds to a change in a parameter value greater than a specified threshold value.

62. The apparatus of claim 53, wherein the controller is adapted to fine-tune the one or more parameter values based on output spectrum of the amplifier.

63. A method for processing an input signal for application to an amplifier to generate an amplified output signal, comprising:

generating an index into a look-up table based on the input signal;

adjusting the index to compensate for changes in operating characteristics of the amplifier over time;

retrieving one or more pre-distortion parameters from the look-up table based on the adjusted index;

pre-distorting the input signal based on the one or more pre-distortion parameters to generate a pre-distorted input signal for application to the amplifier; and amplifying the pre-distorted input signal with the amplifier to generate the amplified output signal, wherein amplifying the pre-distorted input signal comprises controlling overall gain of the amplifier to compensate for the changes in the operating characteristics of the amplifier.

64. The method of claim 63, wherein the overall gain is controlled based on a comparison of power of the pre-distorted input signal and power of the amplified output signal.

65. The method of claim 63, wherein the overall gain is controlled to reduce distortion in the amplified output signal.

66. The method of claim 63, wherein amplifying the pre-distorted input signal further comprises controlling bias applied to one or more amplifier stages of the amplifier.

67. Apparatus for processing an input signal for application to an amplifier to generate an amplified output signal, comprising:
an index generator adapted to generate an index into a look-up table based on the input signal;
an index adjuster adapted to adjust the index to compensate for changes in operating characteristics of the amplifier over time;
the look-up table adapted to provide one or more pre-distortion parameters based on the adjusted index;
a pre-distorter adapted to pre-distort the input signal based on the one or more pre-distortion parameters to generate a pre-distorted input signal for application to the amplifier; and
the amplifier adapted to amplify the pre-distorted input signal to generate the amplified output signal, wherein the amplifier is adapted to control overall gain of the amplifier to compensate for the changes in the operating characteristics of the amplifier.

68. The apparatus of claim 67, wherein the amplifier is adapted to control the overall gain based on a comparison of power of the pre-distorted input signal and power of the amplified output signal.

69. The apparatus of claim 67, wherein the overall gain is controlled to reduce distortion in the amplified output signal.

70. The apparatus of claim 67, wherein the amplifier is further adapted to control bias applied to one or more amplifier stages of the amplifier.

71. A method for processing an input signal for application to an amplifier to generate an amplified output signal, comprising:
generating an index into a look-up table based on the input signal;
adjusting the index to compensate for changes in operating characteristics of the amplifier over time;
retrieving one or more pre-distortion parameters from the look-up table based on the adjusted index;
pre-distorting the input signal based on the one or more pre-distortion parameters to generate a pre-distorted input signal for application to the amplifier; and
amplifying the pre-distorted input signal with the amplifier to generate the amplified output signal, wherein amplifying the pre-distorted input signal comprises controlling bias applied to one or more amplifier stages of the amplifier.

72. The method of claim 71, wherein the bias is controlled based on a measure of distortion in the amplified output signal.

73. The method of claim 72, wherein the measure of distortion is based on a narrow-band power level in the amplified output signal.

74. Apparatus for processing an input signal for application to an amplifier to generate an amplified output signal, comprising:
an index generator adapted to generate an index into a look-up table based on the input signal;
an index adjuster adapted to adjust the index to compensate for changes in operating characteristics of the amplifier over time;
the look-up table adapted to provide one or more pre-distortion parameters based on the adjusted index;
a pre-distorter adapted to pre-distort the input signal based on the one or more pre-distortion parameters to generate a pre-distorted input signal for application to the amplifier; and
the amplifier adapted to amplify the pre-distorted input signal to generate the amplified output signal, wherein the amplifier is adapted to control bias applied to one or more amplifier stages of the amplifier.

75. The apparatus of claim 74, wherein the amplifier is adapted to control the bias based on a measure of distortion in the amplified output signal.

76. The apparatus of claim 75, wherein the measure of distortion is based on a narrow-band power level in the amplified output signal.

77. Apparatus for processing an input signal for application to an amplifier to generate an amplified output signal, comprising:
an index generator adapted to generate an index into a look-up table based on the input signal;
an index adjuster adapted to adjust the index to compensate for changes in operating characteristics of the amplifier over time;
the look-up table adapted to provide one or more pre-distortion parameters based on the adjusted index;
a pre-distorter adapted to pre-distort the input signal based on the one or more pre-distortion parameters to generate a pre-distorted input signal for application to the amplifier;
the amplifier adapted to amplify the pre-distorted input signal to generate the amplified output signal;
a first power detector adapted to detect power of the pre-distorted input signal;
a second power detector adapted to detect power of the amplified output signal;
a receiver adapted to detect narrow-band power of the amplified output signal at a selected frequency; and
a controller adapted to process the detected powers from the first and second power detectors and from the receiver to generate one or more control signals used to control operations within the apparatus.

78. The apparatus of claim 77, wherein the one or more control signals control the index adjuster, a variable attenuator in the amplifier, and bias levels applied to one or more amplifier stages in the amplifier.

79. The apparatus of claim 77, wherein the first and second power detectors are wide-band power detectors.

80. The apparatus of claim 77, wherein the controller is adapted to change the selection of the frequency of the receiver.

* * * * *